United States Patent
Emma et al.

(10) Patent No.: US 7,015,570 B2
(45) Date of Patent: Mar. 21, 2006

(54) ELECTRONIC SUBSTRATE WITH INBOARD TERMINAL ARRAY, PERIMETER TERMINAL ARRAY AND EXTERIOR TERMINAL ARRAY ON A SECOND SURFACE AND MODULE AND SYSTEM INCLUDING THE SUBSTRATE

(75) Inventors: Philip G. Emma, Danbury, CT (US); Arthur R. Zingher, White Plains, NY (US)

(73) Assignee: International Business Machines Corp., Armonk, NY (US)

(*) Notice: Subject to any disclaimer, the term of this patent is extended or adjusted under 35 U.S.C. 154(b) by 24 days.

(21) Appl. No.: 10/314,574

(22) Filed: Dec. 9, 2002

(65) Prior Publication Data

US 2004/0108591 A1 Jun. 10, 2004

(51) Int. Cl.
- H01L 23/48 (2006.01)
- H01L 29/786 (2006.01)
- G02F 1/136 (2006.01)
- G02F 1/1343 (2006.01)
- G09F 9/35 (2006.01)

(52) U.S. Cl. .................. 257/685; 257/723; 257/686; 257/777; 257/696; 257/698; 257/203; 257/211; 257/207; 257/208; 257/758; 257/700; 257/701; 257/668

(58) Field of Classification Search ............... 257/675, 257/723, 686, 777, 696, 698, 203, 211, 207, 257/208, 758, 700, 701, 668
See application file for complete search history.

(56) References Cited

U.S. PATENT DOCUMENTS

| | | | | |
|---|---|---|---|---|
| 5,633,783 A | * | 5/1997 | Yamamoto | 361/704 |
| 5,825,085 A | * | 10/1998 | Masumoto et al. | 257/704 |
| 5,942,797 A | * | 8/1999 | Terasawa | 257/723 |
| 6,104,629 A | * | 8/2000 | Wu | 365/63 |
| 6,329,715 B1 | * | 12/2001 | Hayashi | 257/724 |
| 6,365,978 B1 | * | 4/2002 | Ibnabdeljalil et al. | 257/786 |
| 6,710,263 B1 | * | 3/2004 | Kobayashi et al. | 174/260 |
| 6,797,891 B1 | * | 9/2004 | Blair et al. | 174/268 |
| 6,836,006 B1 | * | 12/2004 | Muto et al. | 257/686 |
| 6,836,138 B1 | * | 12/2004 | Park et al. | 324/765 |
| 6,867,688 B1 | * | 3/2005 | Lamb | 340/286.02 |
| 6,882,034 B1 | * | 4/2005 | Corisis et al. | 257/668 |
| 2001/0023983 A1 | * | 9/2001 | Kobayashi et al. | 257/698 |
| 2001/0024389 A1 | * | 9/2001 | Funaba et al. | 365/200 |
| 2002/0020910 A1 | * | 2/2002 | Kinouchi et al. | 257/697 |
| 2002/0089052 A1 | * | 7/2002 | Yamaura et al. | 257/690 |
| 2002/0117330 A1 | * | 8/2002 | Eldridge et al. | 174/260 |

(Continued)

*Primary Examiner*—Alexander Oscar Williams
(74) *Attorney, Agent, or Firm*—Law Office of Charles W. Peterson, Jr.; Louis J. Percello, Esq.; Satheesh K. Karra, Esq.

(57) ABSTRACT

A multi-connect substrate, module including the substrate and an Integrated Circuit (IC) chip packaged in the module. The multi-connect substrate includes a multilayered substrate with at least one edge terminal array and one inboard terminal array on one face. An exterior terminal array is located on an opposite face. Signal wires pass through the multilayered substrate, connecting edge terminals to inboard terminals and inboard terminals with a exterior array terminals.

35 Claims, 11 Drawing Sheets

U.S. PATENT DOCUMENTS

| | | | |
|---|---|---|---|
| 2002/0163070 A1 * | 11/2002 | Choi | 257/692 |
| 2003/0067060 A1 * | 4/2003 | Corisis et al. | 257/668 |
| 2003/0209783 A1 * | 11/2003 | Casati et al. | 257/659 |
| 2004/0118587 A1 * | 6/2004 | Gilliland | 174/52.4 |
| 2004/0238934 A1 * | 12/2004 | Warner et al. | 257/686 |
| 2004/0245617 A1 * | 12/2004 | Damberg et al. | 257/686 |
| 2005/0040518 A1 * | 2/2005 | Brandenburg et al. | 257/712 |
| 2005/0063635 A1 * | 3/2005 | Yamada et al. | 385/14 |

* cited by examiner

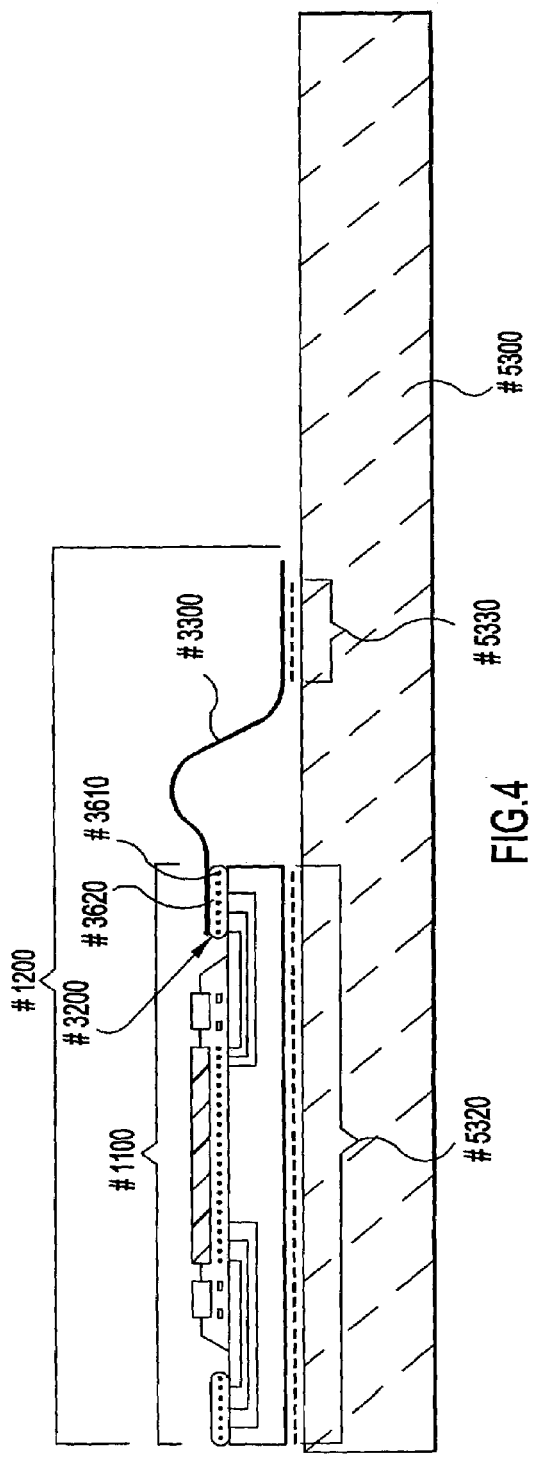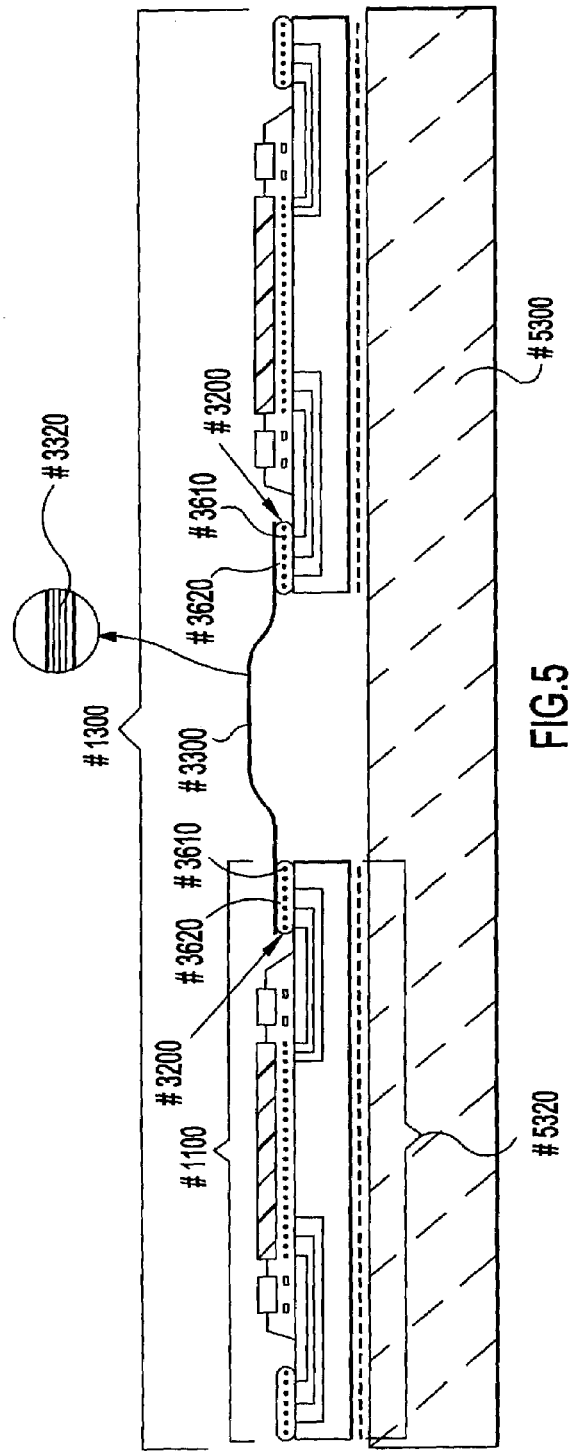

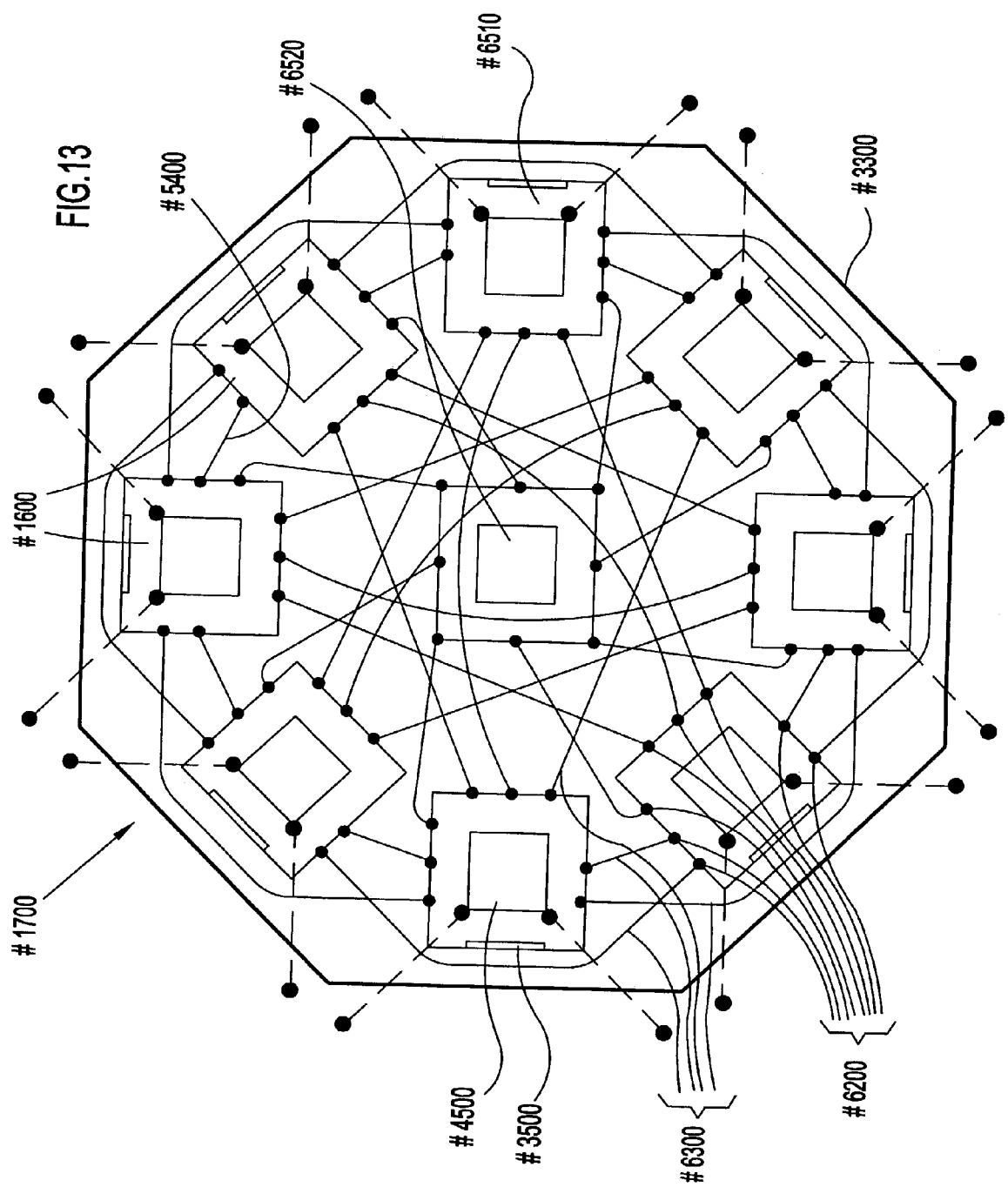

ELECTRONIC SUBSTRATE WITH INBOARD TERMINAL ARRAY, PERIMETER TERMINAL ARRAY AND EXTERIOR TERMINAL ARRAY ON A SECOND SURFACE AND MODULE AND SYSTEM INCLUDING THE SUBSTRATE

CROSS REFERENCE TO RELATED APPLICATION

The present invention is a related to U.S. patent application Ser. No. 10/314,599, entitled "INTEGRATED CIRCUIT CHIP PACKAGE WITH FORMABLE INTERMEDIATE 3D WIRING STRUCTURE" to Philip Emma et al., filed coincident herewith, and assigned to the assignee of the present invention, issued Oct. 4, 2005 as U.S. Pat. No. 6,952,352 A2.

BACKGROUND OF THE INVENTION

1. Field of the Invention

The present invention generally relates to integrated circuit interconnection (packaging) and in particular, to connecting one or more integrated circuit chips together, to a module substrate or a printed circuit card. Also, the present invention relates to the logical engineering of computers, particularly to the structure for cache and memory.

2. Description of the Related Art

List of Abbreviations: As used herein, the following are abbreviated be understood.

MicroProcessor is abbreviated "uP". The standard abbreviation for "micro-" is the lower-case Greek letter "mu", whose shape is similar to the shape of the lower-case Roman letter "u". By contrast "MP" is sometimes used to abbreviate "Multi Processor".
"Edge Flower" is abbreviated "EdgFlr"
"Substrate" is abbreviated "SS"
"Printed Wire Vehicle" is abbreviated "PWV".
"Exterior" is abbreviated "Ext"
"Few Chip Module" is abbreviated "FCM".
"Plural Substrate Module" is abbreviated "PSM".
"Many Chip Module" is abbreviated "MCM".
"Local" is abbreviated "Lcl".
"Global" is abbreviated "Gbl".
"Printed Wire Vehicle" is abbreviated "PWV".
"Printed Wire Card" is abbreviated "PWC".
"Printed Wire Board" is abbreviated "PWB".
"Printed Wire Vehicle" (PWV) is understood to include several species: Flexible Printed Wire Vehicle (FPWV), rigid Printed Wire Card (PWC), rigid Printed Wire Board (PWB).
"Microprocessor" is abbreviated "uP".
"Main Memory" is abbreviated "MM".
"Input Output Processor" is abbreviated "IOP".

In engineering a server computer, it is very desirable to increase number of Signal Wires between a uP IC Chip and other components. More Signal Wires typically enable more parallel, faster data transfer. Unfortunately, this is a challenge for the art of "electronic interconnections" (also called "electronic packaging" or "electronic wiring").

Some uP IC Chips connect through thousands of terminals with tiny pitch (e.g.: 0.225 mm). This requires a great density of signal wires, beyond the capability of a low-cost Printed Wire Card (PWC). Instead, this uP IC Chip is mounted on a specialized Substrate that provides a great density of wires. A MultiLayer Ceramic (MLC) Substrate uses many layers of ceramic insulator and metal wires. These are laminated together and sintered into a hard "brick". This Substrate has Signal Wires which fans out to a "Exterior Terminal Array" with less tight pitch (e.g: 1.27 mm). This Exterior Terminal Array connects to an Exterior Printed Vehicle (ExtPWV). However, to provide thousands of signal wires at this pitch require more layers and significantly raises fabrication cost. Therefore typically the ExtPWV is a relatively thick and relatively costly Exterior Printed Wire Board (ExtPWB). To provide even more denser terminals and signal wires is a challenge. This problem is called "Substrate-Board Strangulation".

A Server Computer includes a microprocessor (uP) and a Main Memory (MM). According to Moore's Law, during many years, uP cycle time has decreased exponentially. Meanwhile, MM access time has decreased only slightly. Therefore data transfer between uP and MM very often delays the Computer.

A partial solution is to add a small fast Cache memory closely linked to the uP. This Cache holds some recently used data. When the uP request this data, it can be rapidly read to the uP.

To simplify many details, the Cache Miss Rate scales approximately as the inverse square root of the size of the Cache. Thus, a much larger Cache will provide a significantly smaller Cache Miss Rate, and thus resolve the Memory Bottleneck problem. However, the desired giant Cache exceeds the available area on a practical uP IC Chip. Therefore this Cache cannot be included on the uP IC Chip.

Further, for a Mainframe Server Computer, the desired Cache IC Chips exceeds the available area on a practical MCM Substrate (see below regarding MCM substrates). Therefore, these Cache IC Chips also cannot be mounted directly on this Substrate. A typical PWB DOES have enough area adjacent to mount Cache IC Chips on the PWB adjacent the MCM with uP IC Chips. Nevertheless, the Substrate-Board Strangulation does NOT allow enough additional Terminals and Wires to adequately link these uPs and Cache Chips.

However, when the uP requests data that is not in this Cache, then a "Cache Miss" occurs, and it is necessary to read data from MM to uP. This is very slow compared to cycle time of the uP. Too often, the uP must waste time waiting for this data. (It is difficult to use this waiting time, in spite of many complex methods, such as multiple execution threads or execution look-ahead.) Unfortunately, the Cache Miss Rate (probability) is not small enough, compared to the uP cycle time and MM access time. Thus the uP wastes considerable time waiting for data from MM. In mainframe computers vintage 1998–2002, the wasted time often exceeds 35%. This problem is sometimes called the "Memory Bottleneck". This will become more severe in future years, with exponentially faster uP but unimproved MM.

Mainframe Server Computer (such as IBM z9000) have many uPs, with wide-band links to a "Shared Cache". This includes a very large MLC Substrate. The Top Face connects many IC Chips. This structure is called a "Many Chip Module" (MCM). These chips include many uP IC Chips and a few Cache IC Chips. Also, this Substrate provides many Signal Wires, from Chip to Chip within this Substrate, and from Chip to Exterior Terminal Array to PWB.

A Mainframe Server Computer with MCM exacerbates the above problems, compared to many other computers of similar vintage. Substrate-Board Strangulation is a greater challenge because an MCM has tighter integration. The Memory Bottleneck is a greater challenge because a Mainframe typically has a faster uP.

Intel Inc. typically mounts its Pentium 4 uP chip with DRAM Cache Chips on a package. This package, on its bottom face, has an area-array of pins. This package, along one end, has an edge connector to provide power and ground.

INCEP Inc., of San Diego Calif., mounts a uP chip together with an "On-Package Voltage Regulator". On the bottom of this package, there is an area-array of pins. There is a planar voltage regulator connected to terminals on top of the package.

U.S. Pat. No. 5,963,427, "MultiChip Module with Flexible Circuit Board" to Vernon Bollsen teaches Plural Chips bonded to Flexible Printed Wire, and bent around a Heat Sink. This subassembly is bonded to a Printed Wire Board.

U.S. Pat. No. 5,926,369, "Vertically Integrated Multi-Chip Circuit Package with Heat-Sink Support" to Anthony Ingraham et al. teaches attaching plural chips on Flexible Printed Wiring, then folds this around a heat sink. This assembly is attached onto a large substrate.

Further, a typical state of the art substrate provides a Top Face with a Terminal Array for an IC Chip, and provides a Bottom Face with Terminal Array for an Exterior Printed Wire Board. In important cases, the latter Bottom Face Terminal Array and the Exterior Printed Wire Board severely restrict external connectivity.

SUMMARY OF THE INVENTION

It is a purpose of the invention is to resolve Memory Bottlenecks;

It is another purpose of the invention to enhance Mainframe Server Computers;

It is yet another purpose of the invention to add a giant Cache directly linked through many Signal Wires to many microprocessors (uP);

It is yet another purpose of the invention to provide a very large Cache closely linked to an individual uP.

It is yet another purpose of the invention to resolve the Substrate-Board Strangulation problems It is yet another purpose of the invention to enhance Substrates and Modules for mounting uP IC Chips;

It is yet another purpose of the invention to provide much more external connectivity, from an IC Chip, through the Substrate, to components external from the Substrate;

It is yet another purpose of the invention to improve connectivity to both substrates for an individual uP IC Chip and to substrates for many uP IC Chips;

It is yet another purpose of the invention to improve uP packaging while maintaining maximum compatibility with preexisting technology and tools for fabricate Substrates and to assemble Modules;

The present invention relates to a Substrate that has a Top Face with a Long Edge, which has a novel preferred embodiment Terminal Array. In preferred embodiment Module, this Array connects to a preferred embodiment printed Wire Vehicle (PWV), which connects to an external component. This PWV may be rigid or flexible. A preferred embodiment Few Chip Module (FCM) connects, through a preferred embodiment Terminal Array, through a Flexible PWV, to additional IC Chips. Thus a preferred embodiment Engine Module connects, through the PWV, to many memory IC Chips, and also connects, through the top center of this Module, to a uP IC Chip. This preferred embodiment Engine Module is very synergistic. This provides a giant Cache, linked through many Signal Wires and very wide total bandwidth, to the uP. This reduces the Cache Miss Rate and improves uP performance. These Module encapsulate a powerful computer, and facilitates modularity and testing. This facilitates: common hardware between computer families, enlarged markets, enlarged production volume, reduced cost.

A preferred embodiment Plural Substrate Module (PSM) has preferred embodiment Substrates mutually connected through a Rigid Global PWV. This efficiently provides abundant connectivity between these Substrates, above and beyond classical connectivity from each Substrate to the Exterior PWB. For a system with many IC Chip closely linked, this PSM provides many advantages over the prior art of Many Chip Module (MCM). A preferred embodiment Compound Engine Network combines PSM and many preferred embodiment Engine Modules. This provides many uPs and many giant Caches, linked by many Signal Wire Bundles. Thus all uPs are directly linked: to all Caches, to Main Memory, to an Input-Output Processor.

BRIEF DESCRIPTION OF THE DRAWINGS

The foregoing and other objects, aspects and advantages will be better understood from the following detailed description of illustrative embodiments of the invention with reference to the drawings, in which:

FIG. 4 shows a preferred embodiment Module with two paths to an Exterior PWV;

FIG. 5 shows a preferred embodiment Flexible Plural Substrate Module (PSM);

FIG. 13 is a logical block diagram of the preferred embodiment Engine Network with 8 Engine Modules.

DESCRIPTION OF PREFERRED EMBODIMENTS OF THE INVENTION

Figure 1:
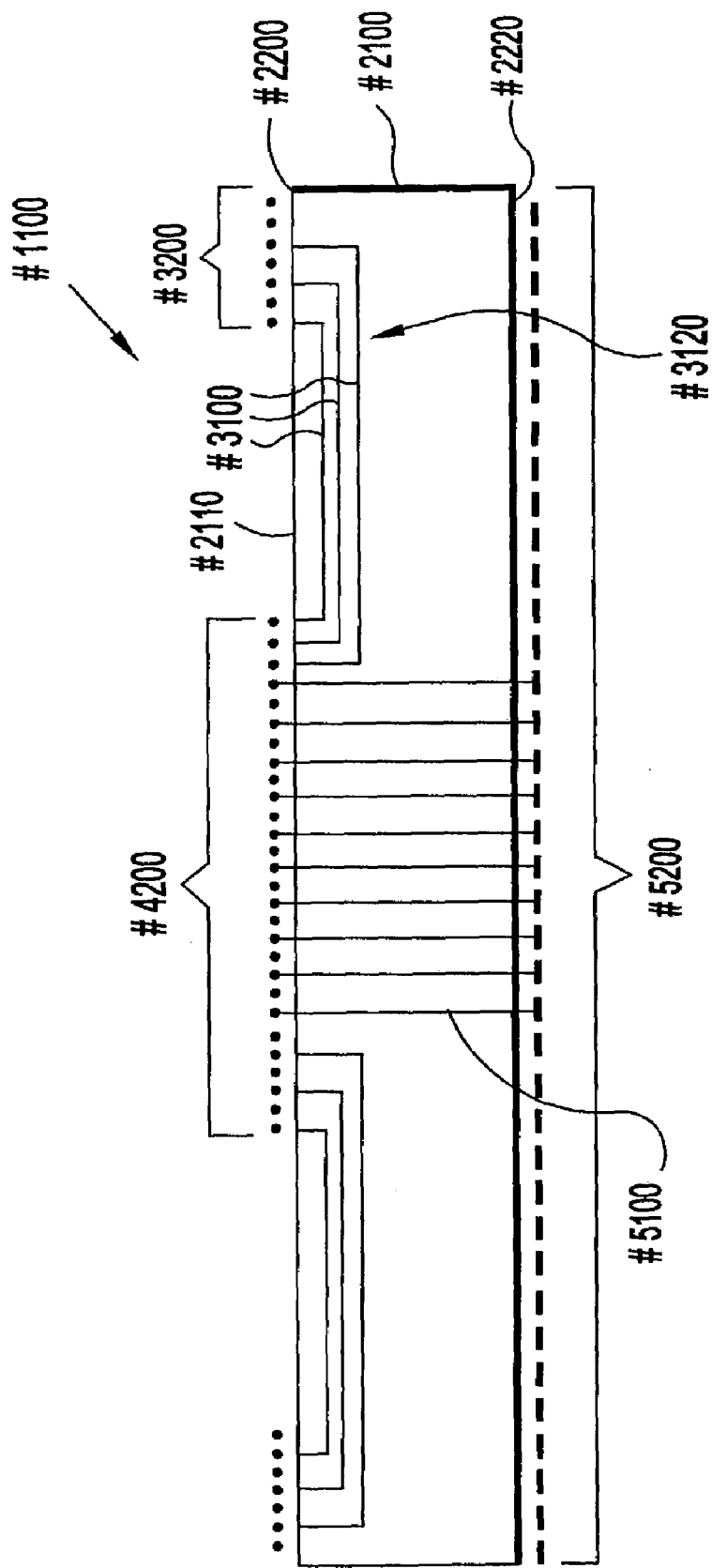
FIG. 1 shows a preferred embodiment Substrate.

Terminology:

It is useful to distinguish several terms: "Printed Wire Card", "Printed Wire Board", "Printed Wire Vehicle", "Substrate", "Module". All five can provide Terminal Array(s) and Signal Wire(s).

A Substrate is specialized to mount a semiconductor IC Chip, and specialized to fan out, from an IC Chip with very tightly spaced terminals, to less tightly spaced terminals which mate with a PWC or PWB.

A semiconductor typically has a small Thermal Expansion Coefficient (TEC). A Substrate must match this small TEC without causing high stress.

Almost all Substrates have a small TEC. Most Substrates include ceramic materials, with low TEC. A few Substrates use hydrocarbon polymers, with large TEC, over a stiff core with very low TEC, such as Invar or Molybdenum or ceramic. In combination, this provides a small TEC.

Some unusual Substrates use a fluro-polymer insulator. This has a large TEC, but has a very soft Elastic Modules. This Substrate stretches with low stress. Thus this can match the small TEC of a semiconductor without causing high stress.

A Module is a Substrate bonded with additional components. Most often, this is an IC Chip bonded. Occasionally, this can be another PWV.

Unlike a Substrate, a PWC or PWB does NOT match the low TEC of a semiconductor. A PWC and PWB are both embodiments of a PWV. In most cases, a PWC or PWB uses hydrocarbon polymer insulator with considerably larger TEC. A Rigid PWV typically includes glass fibers for rigidity and strength. A Flexible PWV enables bendability by avoid such fibers or stiff core layers. Also for flexibility, a Flexible PWV is quite thin, with very few layers.

A PWC typically has fewer layers, and less cost/area. The PWB typically has more layers, and more cost/area.

Unless specifically noted otherwise, for convenience of description the following definitions are intended below with reference to the appropriate corresponding term. A Signal Wire is a transmission line, a wire adjacent to a shield plane or return wire, with controlled AC impedance. By contrast, power and ground distribution is in pairs of broad planes. A Substrate includes multiple layers of ceramic insulators, metal conductors, metal vias, and plated metal terminals that may include signal wires or power and ground distribution planes. An edge Terminal Array is a rectangular array of terminals along the perimeter or edge of one face of a Substrate. An Inboard Terminal Array is an array of terminals inboard of at least one edge Terminal Array and on the same face of the Substrate. An Exterior Terminal Array is an array of terminals on another face of such a Substrate. A preferred Substrate includes a Substrate with an edge Terminal Array and an Inboard Terminal Array on one face and an Exterior Terminal Array on another (e.g. the opposite) face with signal wires running there between. Further, a preferred Module is a module containing a preferred Substrate. A preferred Plural Module is a module containing more than one preferred Substrate.

FIG. 1 shows an example of a preferred embodiment Substrate #1100. This includes a Substrate #2100 with a least two faces #2110, #2120. The Substrate includes a preferred embodiment edge Terminal Array #3200, an Inboard Terminal Array #4200, and an Exterior Terminal Array #5200. The preferred edge Terminal Array and the Exterior Terminal Array are on different faces. The Inboard Terminal Array is suitable to connect an IC Chip (not visible). The Exterior Terminal Array is suitable to connect an Exterior PWV (Printed Wire Vehicle) (not visible). This Substrate includes Substrate Signal Wires #3100, #5100. Some or all of the edge Terminals are linked by first Substrate Signal Wires #3100 to some or all Inboard Terminals. Some or all Exterior Terminals are linked by second Substrate Signal Wires #5100 to some or all Internal Terminals.

In a preferred embodiment, the Substrate is a wide square shallow rectangular block, with wide square Top and Bottom Faces #2210, #2220. The Inboard Terminal Array and the edge Terminal Array both are on the Top Face. The Exterior Terminal Array is on the Bottom Face. The Top Face includes four Long Edges #2300. Along at least one Long Edge, there is an edge Terminal Array, with many columns of terminals along this Edge, and relatively few rows of terminals perpendicular to this Edge.

In an area array, the total number of terminals is larger than the number of terminals along the perimeter of the array. This contrasts with a perimeter array, where the number of perimeter terminals is comparable to the total number of terminals. An array occupies a major fraction of a face if the array area is more than 30% of the face area.

The Exterior Terminal Array #5200 includes an area array, and occupies a major fraction of the area of the Face where it is located. Preferably this occupies almost all this Face. This maximizes the number of terminals for given face area size and given pitch between terminals. If the Exterior Terminal Array occupies significantly less than a major fraction of this area, then the external connectivity can be significantly increased by using a larger Exterior Terminal Array.

Some or all of these Substrate Signal Wires have a wide pass-band. Herein a "Signal Wires" shall be understood as a means to transfer wide-band signals. In the Substrate, a Signal Wire is embodied by a Transmission Line, formed by a wire adjacent to a shield plane or return wire, with controlled AC impedance. By contrast, distribution of power and ground currents uses pairs of broad planes. Thus Signal Wires can be readily distinguished from power and ground distribution.

In a preferred embodiment, the Substrate includes a volumetric Dedicated Region #3120 between the Inboard Terminal Array and at least one edge Terminal Array. This Dedicated Region contains mostly First Substrate Signal Wires and closely associated objects, particularly shield planes, This Dedicated Region is largely free of other Substrate Signal Wires or obstructions. In a preferred embodiment, these First Substrate Signal Wires are relatively direct, relatively short, relatively straight. This Dedicated Region contrasts with the prior art of Substrates, where the analogous volume was rarely used.

In a preferred embodiment, some Substrate parameters are as follows. Its outer dimensions are about 42.5 mm by 42.5 mm by 5 nm. The Substrate is composed of many layers of ceramic insulators, metal conductors, metal vias, and plated metal terminals. One embodiment is fabricated approximately as follows. Fabrication starts with an unsintered ("green") layers of ceramic. Via holes are punched. Using a "silk-screen process, metal paste is printed onto these layers. This metal defines wires, planes, and vias. These layers are stacked together, then laminated, and sintered into a hard ceramic "brick". Metal terminal are plated onto the outside of this brick. Finally, this Substrate is tested electrically. This construction is often called a MultiLayer Ceramic Substrate, abbreviated MLC SS.

The Inboard Terminal Array has pitch 0.225 mm, which enable many terminals. For example, an Array of 55*55=3035 terminals occupies about [12.38 mm]^2.

The Exterior Terminal Array has pitch about ¹⁄₂₀ of an inch, or 1.27 mm. Thus an Array of 32*32=1024 terminals occupies about [40.64 mm]^2 which fills the Bottom Face. Pitch 1.27 mm mates with a lower-cost lower-density Exterior PWV. By contrast, pitch 1.00 mm would allow 40*40=1600 terminals in about [40.0 mm]^2. However, this would require a Exterior PWV with more density and more cost.

In the prior art of Circuit Substrates, outboard terminals are provided only by an Exterior Terminal Array. This has far fewer terminals than Inboard Terminal Array. Thus, in the prior art, the Exterior Terminal Array severely restricts ("strangles") the number of outboard connections (also called "external connectivity") of the Circuit Substrate.

By contrast, this invention adds novel edge Terminals that add considerable more external connectivity. In a preferred embodiment, the Top Face has 4 Long Edges with 4 edge Terminal Arrays. Each Array occupies a trapezoidal region along a Long Edge. The preferred pitch is 0.675 mm, and each Array has 10 rows with 44 to 27 columns, for a total of 360 terminals per Array. Thus 4 edge Terminal Array together provide 1440 edge Terminals per preferred embodiment Substrate. This significantly augments the 1024 terminals on the Exterior Terminal Array.

This invention enables a large fractional improvement in total external connectivity. This improvement is due to both the additional area and the tighter pitch (of edge Terminal Array compared to Exterior Terminal Array).

It should be noted that these Three Arrays (Inboard, edge, Exterior) have appreciably unequal pitches. These correspond to the geometric tolerances for mating with corresponding components (as shall be explained below). Therefore the Inboard has tightest pitch; the edge has intermediate pitch; the Exterior has widest pitch. Also, the number of terminals per area scales quadratically with pitch, which amplifies differences in pitch.

This invention is highly compatible with prior investment to fabricate prior art Substrates. In particular, this can use the same materials, the same processes, the same fabrication tools, the same factory. The changes may be notable small: different masks (to define the vias, wires, planes, terminals) and different probes arrays (for the final electrical tests). Thus Substrates can have capital cost and incremental fabrication cost almost the same as prior art Substrates. However these Substrates enable considerable more external connectivity than prior art Substrates.

Figure 2:
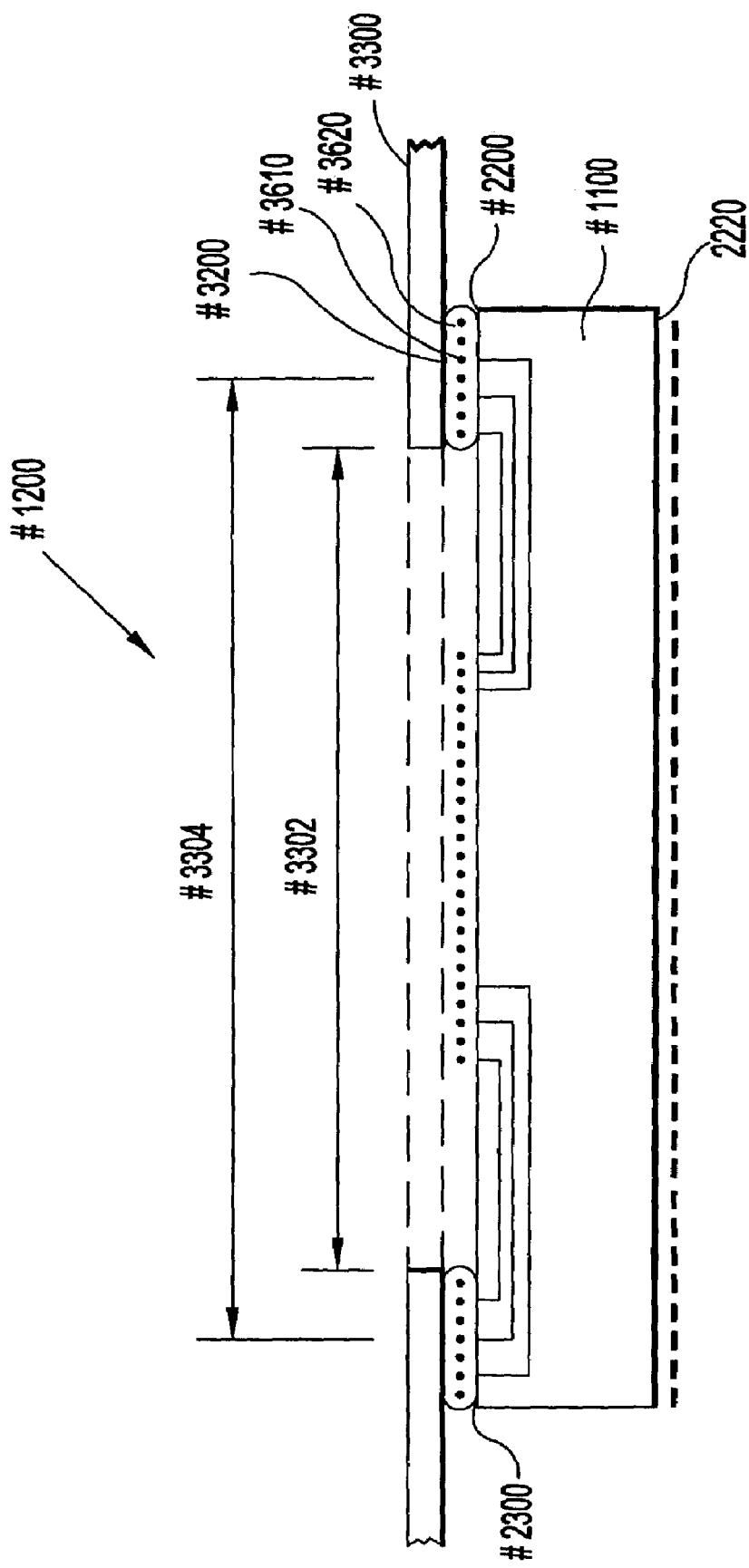
FIG. 2 shows a preferred embodiment Rigid Module.

FIG. 2 shows a preferred embodiment Rigid Module #1200. This embodiment includes an preferred embodiment Substrate #1100 and a Top Face #2210 with two parallel Long Edges each #2300, each with an edge Terminal Array #3200. Also, this includes a Rigid PWV #3300 that straddles the Substrate, and connects to both Terminal Arrays.

In one Embodiment, each edge Terminal Array connects to the Rigid PWV through very small Solder Bonds #3610, with pitch 0.675 mm. Between Solder Bonds, the volume is filled with plastic, called Underfill #3620. Thereafter these Solder Bonds and Underfill are almost permanent, and these Substrates and PWV form a unified Module #1200, that is tested, installed, removed as one unit.

Above the center of the Substrate, there is a Large Hole #3302 in the Rigid PWV. This extends around this Large Hole, but the extensions are outside the plane of this Figure, so are not directly visible.

An outboard force on the PWV will apply an outboard torque. Nevertheless, several important design features prevent damage to the Solder Bonds. This Figure has Axes to indicate Directions #3304-X,Y,Z. The Rigid PWV straddles the preferred embodiment Substrate, and is bonded to both edge Terminal Arrays. This provides a Long Lever Arm #3304 in a Direction #3306-X, perpendicular to these Long Edges. Also, each edge Terminal Array is relatively long in the Direction #3306-Y, parallel to these Long Edges. Therefore, a relatively small local stress on the Bonds will counterbalance a relatively large outboard torque. Also, Underfill can absorb some local stress, and thus reduces the stress on Solder Bonds, and thus improves the durability of the Solder Bonds.

These features help prevent cracked Bonds. This allows the PWV to be rigid and thick, which allows many wire layers, which allows considerable design freedom, which allows wires which cross or branch. This contrasts with the Flexible PWV described below.

Preferably, the PWV includes Signal Wires with wide pass-bands. Therefore these are transmission lines, formed by signal wire layer(s), ground plane layer(s) and dielectric layers. Suitable AC design and printed wire technology is well known in the art.

Figure 3:
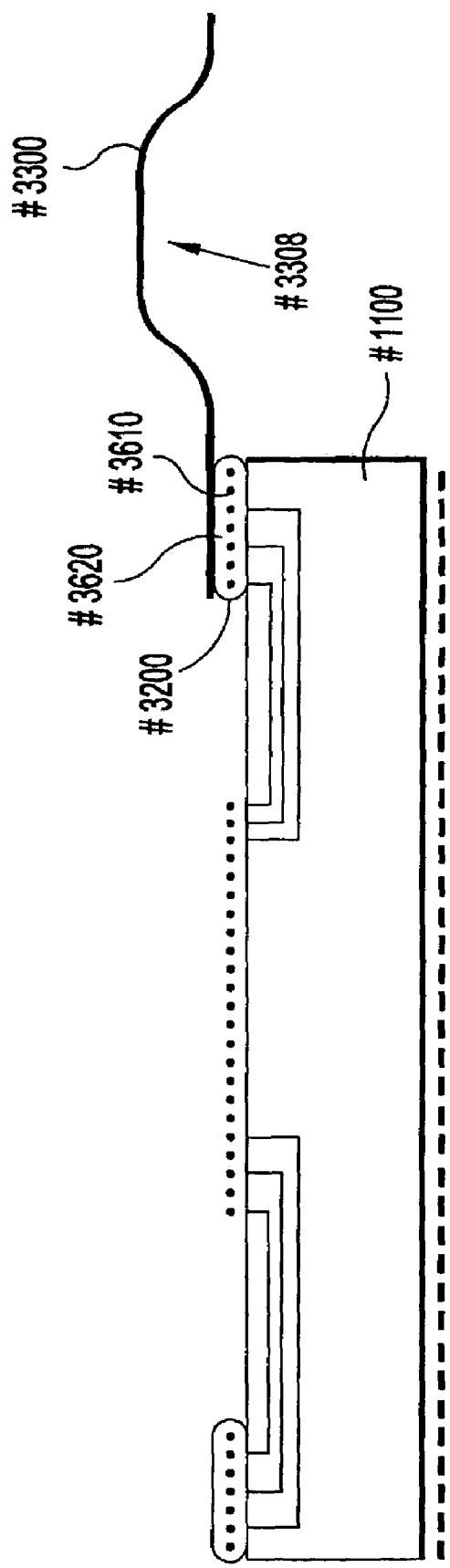
FIG. 3 shows a preferred embodiment Flexible Module.

FIG. 3 shows an example of a preferred embodiment Flexible Module #1200. This preferred embodiment includes SS #1100, with at least one edge Terminal Array #3200 connected to a Flexible PWV #3300.

In the preferred embodiment, these connections are Solder Bonds #3610 and Underfill #3620, Several features prevent stress and cracking of these Solder Bonds. Since the PWV is Flexible, preferably it does not include stiffening materials, i.e., without glass fibers typical of a rigid PWV.

This Figure indicate Directions #3306-X,Y,Z. The Flexible PWV can readily bend in direction #3306-Z. Thus small mechanical perturbations in this direction will not harm the Bonds.

The PWV includes some Slack #3308. This can change shape to relieve some small mechanical perturbations in direction #3306-X. Thus these will not harm the Bonds.

The Flexible PWV is relatively stiff in direction #3306-Y. The edge Terminal Array includes long rows in direction Y. This provides a relatively long inboard Lever Arm in direction Y. Because of this, a large outboard torque can be counterbalanced by a small local stress on the Bonds. Thus, mechanical perturbations in direction Y will not harm the Bonds.

To achieve flexibility, a Flexible PWV must be relatively thin, with relatively few layers. This restricts the maximum density of wires, and restricts the topology of wires. A Flexible PWV can readily provide wires which are parallel topologically and physically. However, a Flexible PWV has restricted capability for permutations and branching of wires. By contrast, a thicker rigid PWV enables more density and more design versatility.

Within these constraints, the Flexible PWV can provide Signal Wires with a wide pass-band. This typically includes signal wire layer(s), ground plane layer(s) and dielectric layers such as are well known in the art. The technology of flexible printed wiring enables considerable density of transmission line wires with suitable electronic properties.

A preferred embodiment Substrate (SS) includes a Top Face with four Long Edges, each with an Terminal Array connected to a PWV. This new connectivity is "edge-oriented", in contrast to "area-oriented" connectivity provided by the Exterior Terminal Array. In a plan view, this Substrate and four PWVs resembles an artificial flower.

The structures of FIGS. 2 and 3 resolve some problems which may be understood by several counterexamples.

A first counterexample has a Rigid PWC with Bonds to External Terminals near a single Long Edge. This has a very small level arm between the preferred embodiment Substrate and the PWC. Therefore an outboard torque on the PWC will produce a large stress on the Bonds, and may lead to cracked bonds.

In a second counterexample, the end of the preferred embodiment Substrate mates through a Socket, to the PWV. This has several disadvantages. The Socket adds cost and complexity. Also, this severely degrades the pitch between terminals (compared to 0.675 mm). If there are Bonds, then these are rigid and vulnerable to stress. If the outboard component is relatively stiff and long, compared to the short Lever-Arm between the Socket and preferred embodiment Substrate, then outboard forces will be multiplied by leverage effects, and cause local stress on the Bonds. Even with Underfill, and thus may cause a serious reliability problem.

This structure is tolerable for a modest number of terminals, such as power distribution. However, this structure does NOT enable dense and numerous Terminals, and does NOT provide the large outboard connectivity of this invention.

In a third counter-example, there is a Perpendicular Card with integral L-shaped Enlarged Foot. This Card is bonded to the preferred edge Terminal Array on a preferred embodiment Substrate. Thus the Enlarged Foot provides more area for attachments to the preferred embodiment Substrate. However, this has problems with leverage, stress, and unreliability, analogous to First counterexample. Thus the third counterexample is unfavorable.

A widely useful family of structures can be summarized: a preferred Substrate connects, through an edge Terminal Array, through a Rigid or Flexible PWV, to an External Structure. This can be: a Chip, a Printed Wire Card or a Printed Wire Board, another preferred Substrate, a Cable. These structures are described below.

FIG. 4 shows an example of a preferred embodiment Module #1200 with two paths to an Exterior PWV #5300. This embodiment includes an preferred Substrate #1100, an edge Terminal Array #3200, a Flexible PWV #3300, a Exterior Terminal Array #5200, a Exterior PWV #5300. This Substrate connects directly: through the Exterior Terminal Array, into an Inner Zone #5320 of the Exterior PWV. In addition, the Substrate connects indirectly: through the edge Terminal Array, through the PWV, through an Outer Zone #5330 on the Exterior PWV.

The Inner Zone is on the Exterior PWV, directly adjacent to the preferred Substrate. The Outer Zone is on the Exterior PWV, but is further from the preferred Substrate. Thus the Substrate and Ext PWV are topologically connected through two distinct Zones on two distinct Paths.

Contrast this invention with a Circuit Substrate according to the Prior Art. That connected a Substrate only through an Inner Zone to the Exterior PWV. Often this restricted ("strangled") the design, or forced the Exterior PWC with finer pitch and higher cost/area.

This invention, in the embodiment of FIG. 4, enables more external connectivity, in spite of a constrained terminal pitch and layer count in the Exterior PWV. In some cases, more connectivity enables a better system design and more performance. In other cases, this invention enables given external connectivity with looser terminal pitch and fewer layers in the Exterior PWV, which may enable lower cost.

Also there are means to mechanically secure the preferred Substrate to the Exterior PWV. Although such mechanical means are well known, these are not shown in the Figures of this invention for graphic clarity. In some embodiments, there are larger Solder Bonds and optional Underfill which connect the preferred Substrate to the Exterior PWV. In other embodiments, there is an array of Compliant Connectors plus a Clamp to force together the preferred Substrate and Exterior PWV.

FIG. 5 embodies a preferred Flexible Plural Substrate Module (PSM) #1300. This includes a Flexible Global PWV #3300, and two or more preferred Substrates #1100. The Flexible Global PWV is connected to each preferred Substrate connects, through its edge Terminal Array #3200 and many Solder Bonds #3610 and Underfill #3620. Between these plural Substrates, this Global FPWV enables a very large number of Signal Wires #3320. Thus plural preferred Substrates are "mutually connected".

Once assembled, this Global PWV and its preferred Substrates almost permanently form a unified PSM. This is tested, installed and removed as one unified Module.

Also, this PSM and its preferred Substrates are mounted onto a Exterior PWV #5300. Each EgFlr Substrate connects through its Exterior Terminal Array #5200 to this Exterior PWV.

Let adjectives "Global" and "Local" be understood as follows. A PSM includes one PWV which connects to all its preferred Substrates connects. Thus one PWV serves all Substrates, so the PWV is "Global". By contrast, each edge Terminal Array serves only its own Substrate, so the Terminal Array is "Local". These adjectives will be useful to describe a preferred Plural Substrate Module, and a preferred Few Chip Module.

The parameters for this Flexible PSM are very similar to other structures described above.

Some electronic systems requires plural IC Chips with very many connections between them. These can be advantageously mounted on this novel Module. Connectivity between these IC Chip is provided by the edge Terminal Arrays and the Global PWV. The connectivity is independent of and unconstrained by the Exterior PWV or Exterior Terminal Array.

Figure 6:
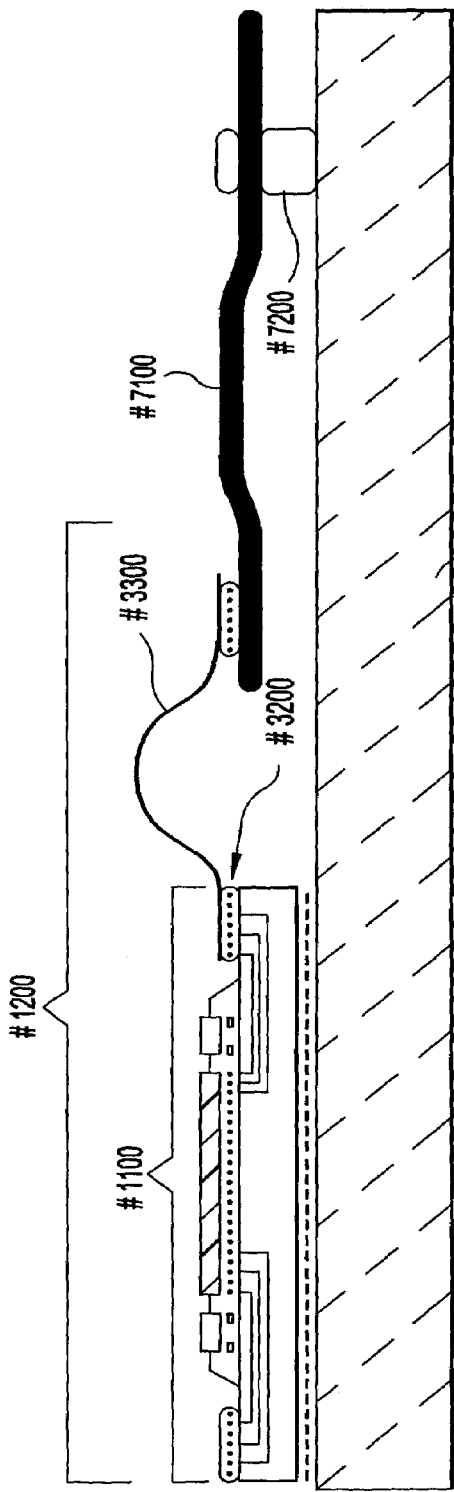
FIG. 6 shows a preferred embodiment Flexible Module with an external Cable.

FIG. 6 embodies a preferred Flexible Module #1200 with an external Cable #7200. This embodiment includes a preferred Substrate #1100, connected through to an edge Terminal Array #3200, through a Flexible PWV#3300, further connected to a Cable #7100. The preferred Module is mounted on a Exterior PWV #5300. A Clamp #7200 mechanically restrains the Cable to the Exterior PWV. This protects the Bonds from some mechanical perturbations of the Cable.

Figure 7:
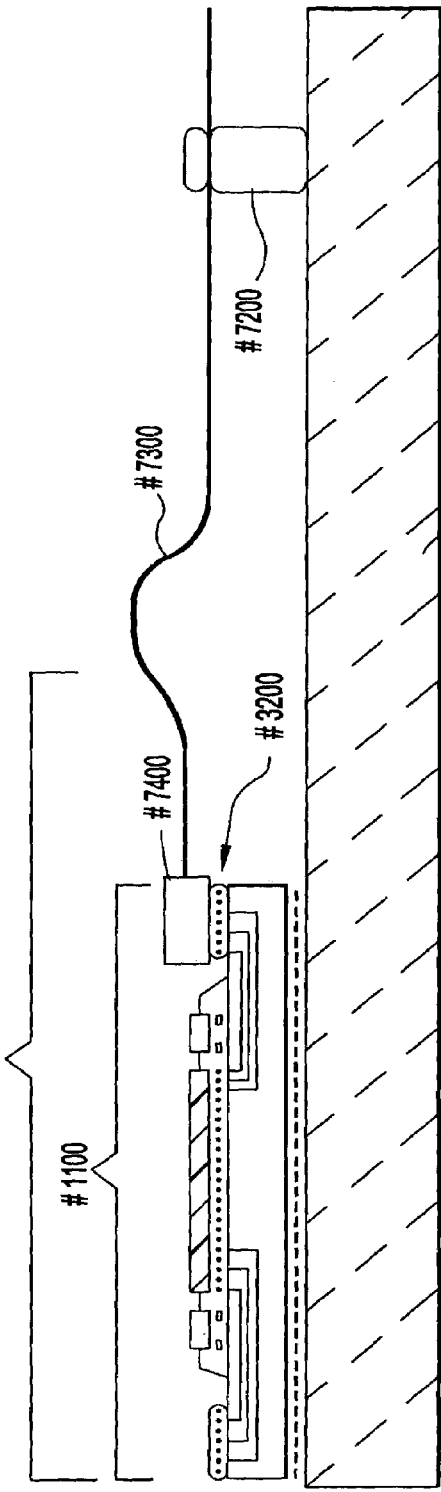
FIG. 7 shows a preferred embodiment Flexible Module with an Optical Fiber.

FIG. 7 embodies a preferred Flexible Module #1200 with an Optical Fiber #7300. This embodiment includes a preferred Substrate #1100, connected through an edge Terminal Array #3120, connected to at least one ElectroOptical Transceiver #7400, further connected to at least one Optical Fiber. There is a Clamp #7200 which mechanically restrains the Optical Fiber #7300

Figure 8:
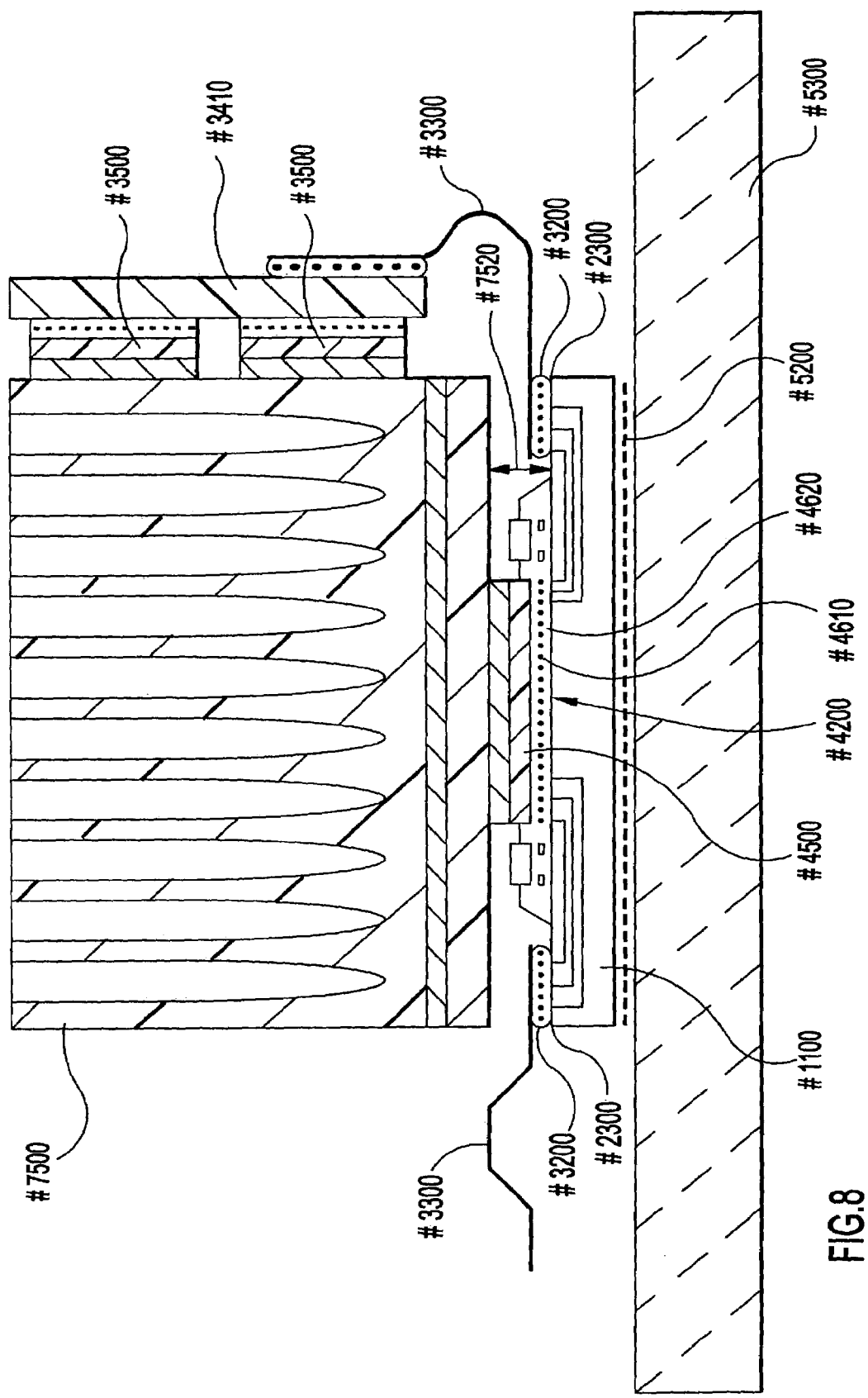
FIG. 8 shows a preferred embodiment Module with Plural Ports.

FIG. 8 shows an example of several overlapping structures. One embodies the physical structure of a preferred Few Chip Module #1400 (FCM). This embodiment includes a preferred Substrate #1100 with an edge Terminal Array #3200, an Inboard Terminal Array #4200, and an Exterior Terminal Array #5200.

This Substrate connects, through an edge Terminal Array #3200, through a Flexible Local PWV #3300, through preferred Signal Wires #3320, through a Sidecard PWV #3410, to one or more preferred IC Chip(s) #3500. Thus, one or more preferred IC Chip(s) #3500 connects, through a Sidecard PWV #3410, through preferred Signal Wires #3320, through an edge Terminal Array #3200, to an preferred Substrate #1100.

This embodiment includes a distinct Sidecard PWV #3410. In a different embodiment, the preferred IC Chip #3500 connects directly to the Flexible Local PWV #3300. Thus the Sidecard PWV #3410 is not included. Let BOTH these embodiments be understood by the phrase "effectively connects through . . . to" in the following clause: "the preferred IC Chip effectively connects through the PWV to the edge Terminals".

This Substrate connects through an Inboard Terminal Array #4200 to an Inboard IC Chip #4300.

This Substrate mounts upon and connects through a Exterior Terminal Array #5200 to the Exterior PWV #5300.

FCM has parameters similar to those described above.

The preferred Substrate has North, South, East and West Long Edges #2300-N,S,E,W on its Top Face. Only the North and South are visible in FIG. 8. Each Long Edge enables an edge Terminal Array, and enables an PWV. Some enable external connectivity similar to embodiments of FIGS. 4 through 7, and others enable preferred IC Chips. This versatility shall be elaborated below, in connection with Plural Ports.

There is an Inboard IC Chip #4500. On top of this is a Heat Spreader #7510 and Air Fin #7500, or other means for cooling. Also, the Air Fin mechanically supports the PWV, Sidecard PWV, and preferred IC Chip(s). In one embodiment, this preferred IC Chip(s) is on the inside of the Sidecard PWV, adjacent to the Air Fin. Thus this chip(s) is cooled through Air Fin. In another embodiment, the preferred IC Chip(s) is located on the outside, where it is cooled directly by flowing air. In both embodiments, the flowing air is NOT blocked by the PWV, Sidecard PWV, preferred IC Chip(s).

In the preferred embodiment, there are tiny solder Bonds #4610 and Underfill #4620 between the Inboard IC Chip #4500 and the Inboard Terminal Array #4200. There is a Gap #7520 between the Heat Spreader and Top Face. This Gap enables the PWV to contact the Substrate. Therefore there is NOT a Cap sealed at the Long Edge. Since this is NOT sealed, therefore ambient air can enter this Module. The Underfill protects the tiny Solder Bonds against chemical attack by gases and vapors in ambient air.

The means for cooling ought to correspond to system parameters, such as cost, local power density, total module power, desired chip temperature, cooling mechanism, coolant fluid. Thus the Cooling Means may vary widely. This topic is generally orthognal to the focus of this invention.

This FCM can provide important resources: mounting space for many preferred IC Chips on the Sidecard PWV; many Signal Wires between preferred IC Chips and the Inboard IC Chip(s); many Signal Wires between Inboard IC Chip(s) and external components. These resources pivotally enable several important structures which achieve valuable synergism.

Also, FIG. 8 shows an example of a preferred embodiment Engine Module #1600. This starts with an FCM #1400 with an Inboard IC Chip #4500 and one or more preferred IC Chip(s) #3500. Furthermore, the Inboard IC Chip includes a microprocessor (uP), and the preferred IC Chip #3500 includes some preferred Memory #3510.

In a preferred embodiment, there are many preferred IC Chips with memory. This memory may be Static or Dynamic (SRAM or DRAM). SRAM enables faster latency, but less logical capacity and more cost. DRAM enables more logical capacity and less cost, but slower latency. The PWV provides many Signal Wires, for a very wide data path between this preferred Memory and the uP. In the preferred embodiment, this preferred Memory is used as a very large preferred Cache. More details are provided below.

In a preferred embodiment, the uP is linked, through the Exterior Terminal Array, through Signal Wires in the Exterior PWV, to Main Memory (MM) (not shown) and at least one Input Output Processor (IOP) (not shown).

Thus a preferred Engine Module provides a uP linked with large bandwidth to a very large preferred Cache. Both are encapsulated inside this Module. This completes a powerful and useful function, and provides important synergism.

The very large Cache directly improves (decreases) the Cache Miss Rate. Indeed, some software programs can operate largely on data in the Very Large Cache in the preferred Memory. These programs can execute largely inside this Module. This directly reduces data transfer between uP and MM. This reduces the Memory Bottleneck and eases Substrate-Board Strangulation as described hereinabove.

An preferred Module enables enhanced external connectivity. The structures of FIG. 12 and 13 will show how this can enable wider bandwidth between uP and MM, and between uP and IOP. These enhancements can accelerate data transfer. (See below re Engine Network using an preferred Compound Module.) Both improvements reduce (decrease) the total time wasted while the uP waits for MM.

Further advantages will be described below, in connection with FIG. 12 and FIG. 13.

The advantages will be commercially important if this preferred Engine Module has low cost and is widely used. This requires a wide spectrum of Computers to use identical Modules. This spreads out the capital investment to design and to begin production of these Modules. This is particularly important because capital costs may dominate incremental costs. This tactic is sometimes named "Common Hardware".

There are several categories of Server Computers. A basic category has a solo microprocessor. An intermediate category has a few microprocessors which logically linked with intermediate bandwidth and latency. An advanced category has more microprocessors which are logically linked with wider bandwidth and faster latency.

However, these categories diverge significantly concerning data transfer to and from each microprocessor. These diverge in the topology of data transfer. These diverge in specifications for data rate, data width, protocol, etc. (For more details, see below re preferred Engine Network.) The preferred Engine Module ought to be "versatile", namely to support communication across this divergence. This versatility is provided by Plural Ports and a Distributor, as described below. Thus a common preferred Engine Module can be used in a wide spectrum of Computers.

A Port provides means to transfer data across (to or from) an external channel. A Port is formed by Terminals and active devices. The former is described in FIG. 8. The latter is described in FIG. 9.

A preferred Engine Module preferably has Plural Ports and a Switch. This efficiently and economically supports a variety of communication topologies.

FIG. 8 shows an example of a preferred Module with Plural Ports #6100. This preferred Substrate has a First Face #2110 with four Long Edges #2300-N,S,E,W (North, South, East, West). In this Figure, only the North and South Ports are visible. There are four Long Edges, with four edge Terminal Arrays #3200-N,S,E,W, with four Ports #6100-N, S,E,W.

In this embodiment, there are additional Ports. There are two or more "uP Ports" #6100-A,B which connect to the uP and Distributor. Also, there are two or more "Exterior Ports" #6100-C,D which pass through the Exterior Terminal Array, and connect to the Exterior PWV.

In one embodiment, the North Port connects through a North PWV #3300-N, through a SideCard #3410-N, to many preferred IC Chips #3500. This leaves five other Ports available for other functions, which shall be described below.

Figure 9:
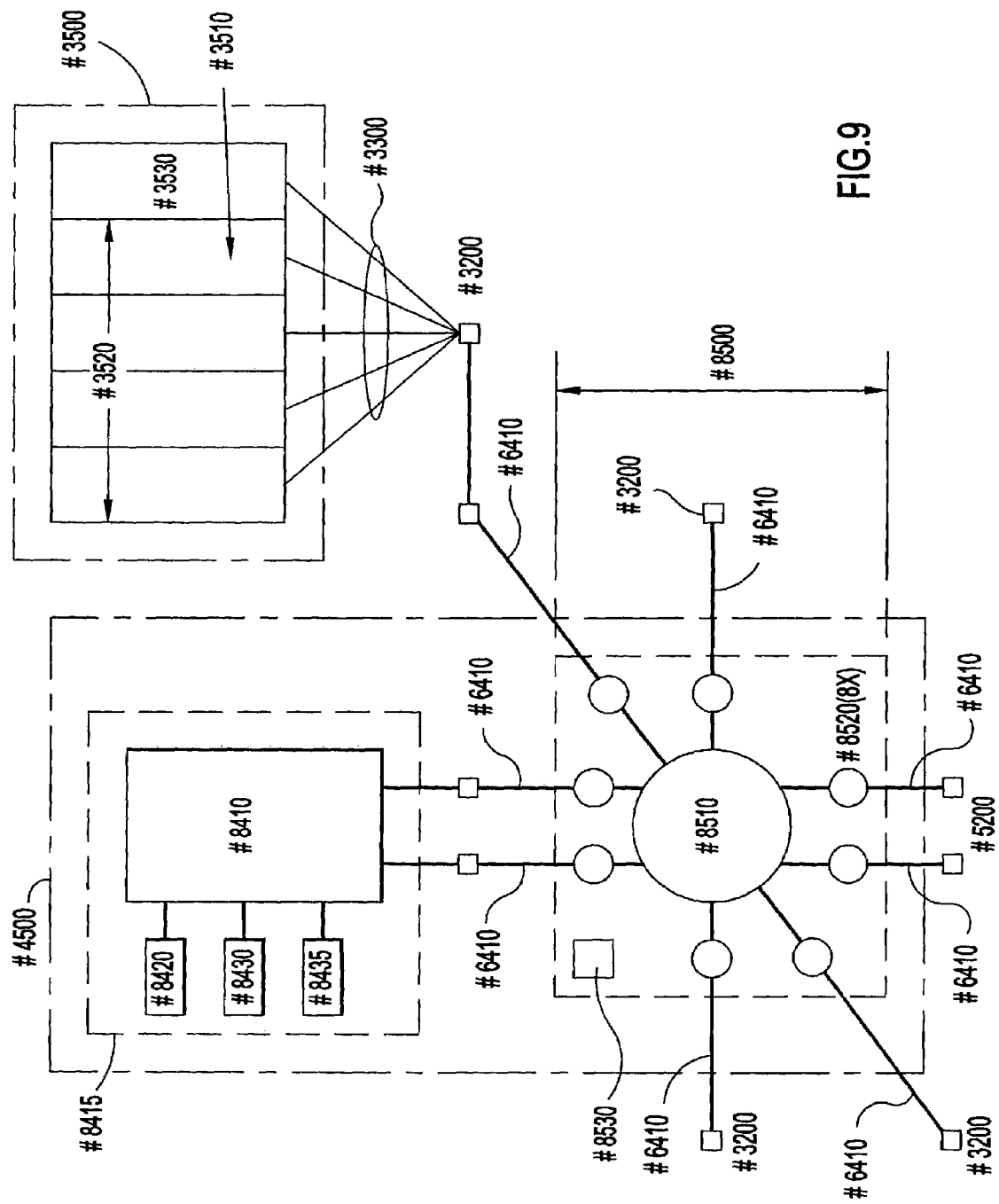
FIG. 9 the logical structure of an preferred embodiment Engine Module.

FIG. 9 embodies the logical structure of a preferred Engine Module #1600. This includes at least one Inboard IC Chip #4500, and includes one or more preferred IC Chip #3500 with preferred Memory #3510.

In a preferred embodiment, the Inboard IC Chip #4500 includes a uP #8410, a tiny Cache #8420 at Memory Level 1, and a small Cache #8430 at Memory Level 2. Also there is a Directory #8435 which lists entries in various Caches. A Central Processing Unit (CPU) #8415 is another name for a uP plus one or more Cache.

In a preferred embodiment, the preferred Memory #3510 is logically used as follows. This provides a very large preferred Cache #3520 at Memory Level 3. Preferably and optionally, this also provides a very large preferred Directory #3530 to list entries in various Caches.

In a preferred embodiment, each Cache is divided into a sub-Cache for Data (not visible), and a sub-Cache for Instructions (not visible).

Furthermore, the Inboard IC includes a Distributor #8500 reconfigurably to transform data flow through and between Ports, uP, and preferred IC Chip(s). In a preferred embodiment, the Distributor includes a Switch #8510, one or more Buffers #8520, and a Controller #8530 and optional Digital Signal Processor (not visible). In this Figure, a number of logically parallel signal lines are symbolized by a single thick line.

The Switch provides reconfigurable means to steer data through between pair of any Ports (N,S,W,E, A,B, C,D). In the preferred embodiment, the Switch includes a wide non-blocking crossbar.

A Buffer provides reconfigurable means to transform data flow through a Port. In a preferred embodiment, this Buffer comprises a large register, a block of logic to write data into this register, and another block of logic to read data from this register. The two blocks have separate clocks. Suitable details are well known in the digital logic design art.

This Buffer provides translation of data frequency and data width (e.g.: from 1.6 GHz at 1 bit width to 0.1 GHz at 16 bit width). This Buffer provides translation of data bandwidth and data duration (e.g.: from 3.2 Gbits/sec during 100 nSec to 1.6 Gbits/sec during 200 nSec). This Buffer provides permutation of bit order. (e.g.: translate from "big-endian bytes" to "little-endian bytes"). Thus, a given preferred Engine Module and given Port can transfer data with an external data channel with various specifications for data frequency, data width, data bandwidth, data duration, bit order.

An optional Digital Signal Processor (DSP) provides programmable means to transform further the data. This adds versatility beyond the fixed functions of the Buffer and Switch. For example, a DSP can translate between various redundancy codes, such as parity bits, Hamming codes, codes to correct and to detect various data errors.

Preferably, each Port #6419-N,S,E,W,A,B,C,D has its own Buffer and optionally has its own DSP.

In the Distributor, there is a Controller with means to configure the Switch, Buffer(s), DSP(s). In one embodiment, the Controller is a tiny CPU, which executes a small program to configure these items. There are control lines which link the Controller with each of these items. In FIG. 9 for graphic clarity, these control lines are not visible.

In design vintage 2002, a representative uP typically has several hundred million transistors. A Distributor can be implemented with much fewer transistors, by several powers of 10. Early in the design of an IC Chip with a uP, to add a Distributor adds a tiny fractional increment in design effort. During fabrication of this IC Chip, inclusion of this Distributor adds a tiny fractional increment in the fabrication cost.

In computer network engineering, it is often necessary to communicate over channels, transmitters and receivers with a various specifications at several levels: voltage levels, data width, data frequency, data bandwidth, data duration, data link protocol (e.g.: Ethernet), network protocol (TCP and IP), etc. To provide this versatility, the state of the art teaches a "layer cake" of communication adapters. Each communication adapter encapsulates a layer and its variations, and hides this variation from other layers. Typically these layers include: physical layer, data link layer, medium access layer, network layer, transport layer, application layer. Depending on the layer, these adapters typically are implemented in hardware, firmware, or software. For more details, please refer to the latest edition of the book "Computer Networks" by author Andrew S. Tanenbaum, published by Prentice Hall, in Upper Saddle River, N.J.

In a preferred embodiment, these communication adapters are implemented as follows. Some lower-layer communication adapters are implemented by the Buffer(s) and Switch. Some intermediate-layer and higher-layer communication adapters are preferably implemented by the DSP, or less preferably are implemented by the uP.

In the preferred embodiment, the preferred Engine Module with a Distributor provides a layer cake of communication adapters. Thus this Module and its Ports can transfer data over an external channel with a variety of specifications.

For a basic category of Server Computer, it is sufficient to provide just one preferred Engine Module.

Moderate performance is sufficient for some computers. Therefore, use an preferred Engine Module. Its uP is multiplexed, to provide both a virtual Input-Output Processor and a virtual uP. The Very Large Cache provides a relatively small Main Memory.

More performance is necessary for other computers. Therefore, use an preferred Engine Module plus a distinct Main Memory and distinct Input-Output Processor.

Intermediate and advanced categories of Server Computers require plural microprocessors which work together.

Another structure of this invention is an Engine Network. This comprises a Network with plural Nodes, with one or more preferred Engine Module connected to one or more Nodes of this Network. Very preferably, this Network also connects to a Main Memory, and connects to an Input-Output Processor.

Two important Engine Networks are described below. One is suitable for an intermediate Server Computer. The other is suitable for an advanced Server Computer.

It is very preferable for each preferred Engine Module to include Plural Ports and a Distributor. This enables identical Modules to be used throughout the basic, intermediate, and advanced categories of Server Computers.

Figure 10:
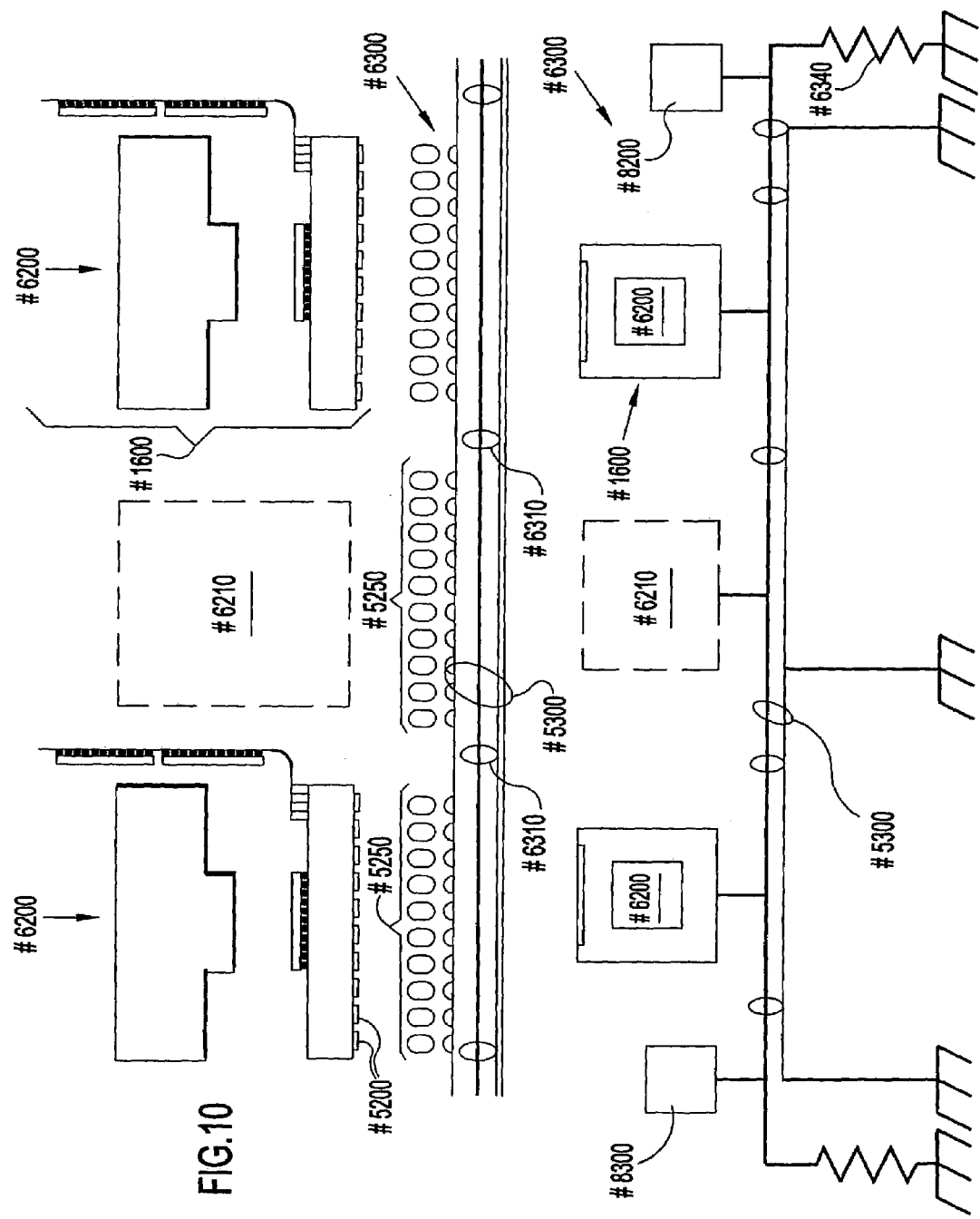
FIG. 10 shows a preferred embodiment Engine Network for a Server Computer.

FIG. 10 embodies an Engine Network #1700 for a Server Computer. This embodiment includes a Network #6300 with Nodes #6200, one or more preferred Engine Module #1600, Main Memory #8200, an Input-Output Processor #8300. Preferable each preferred Engine Modules includes a Distributor (not visible. This Figure includes two parts. The upper part is a vertical physical cross section. The lower part is a block diagram.

This following features are distinctive for this embodiment. The Exterior PWV #5300 provides a Bus #6310 with Nodes #6200. Each Node #6200 provides a Compliant Connector Array #5250 which can mate with an Exterior Terminal Array #5200 of an preferred Engine Module #1600. This Computer can be upgraded in the field, by adding another preferred Engine Module #1600 at an Unoccupied Node #6210.

In the preferred embodiment, at both ends of the Bus, there is Termination #6340. This prevents reflections. Also each Unoccupied Node is simply left unconnected. Other embodiments may add termination at each Unoccupied Node.

The Bus width and Bus frequency varies with the embodiment. In general, lower cost favors a narrower embodiment, and more aggregate bandwidth favors a wider embodiment. In this Figure, the Bus is embodied by one Signal Wire (i.e.: one transmission line). Other embodiments may have a wider Bus. Some embodiments may have an extra wire(s) for redundancy. Some width examples are: 1, 8, 8+1, 32, 32+1, 64, 64+1 Signal Wires in the Bus.

In a preferred embodiment of the preferred Engine Module, there is a Distributor Buffer which can translate the width and frequency of data through a Port. This can match various Bus embodiments.

In one Embodiment, one Engine serves as a Bus Master, to allocate bus time-slots among all devices on the Bus. In another Embodiment, bus time-slots are allocated in a decentralized way, such as an Ether Net protocol. In a preferred Embodiment, any Engine FCM can support Bus Master or Ether Net functions including Interrupts. In an alternate embodiment an extra IC Chip (not shown) is included to operate the bus protocol.

In a preferred Embodiment, each Engine includes a Distributor which can translate data width and data frequency. This enables operation across a range of Busses, across a range of Bus width and Bus frequency.

This provides a field-upgradable system. An entry system includes only the Exterior PWV with Bus and one preferred Engine Module. (Refer above re Basic Server Computer.) This system can be field-upgraded in several steps, by adding hardware at an Unoccupied Node #6210. Additions may include Main Memory of various sizes #8200, one or more Input-Output Processors #8300. Furthermore, additions may include one or more preferred Engine Module #1600. Upgrading can continue until all Nodes are occupied, or until most bus time-slots are allocated.

Figure 11:
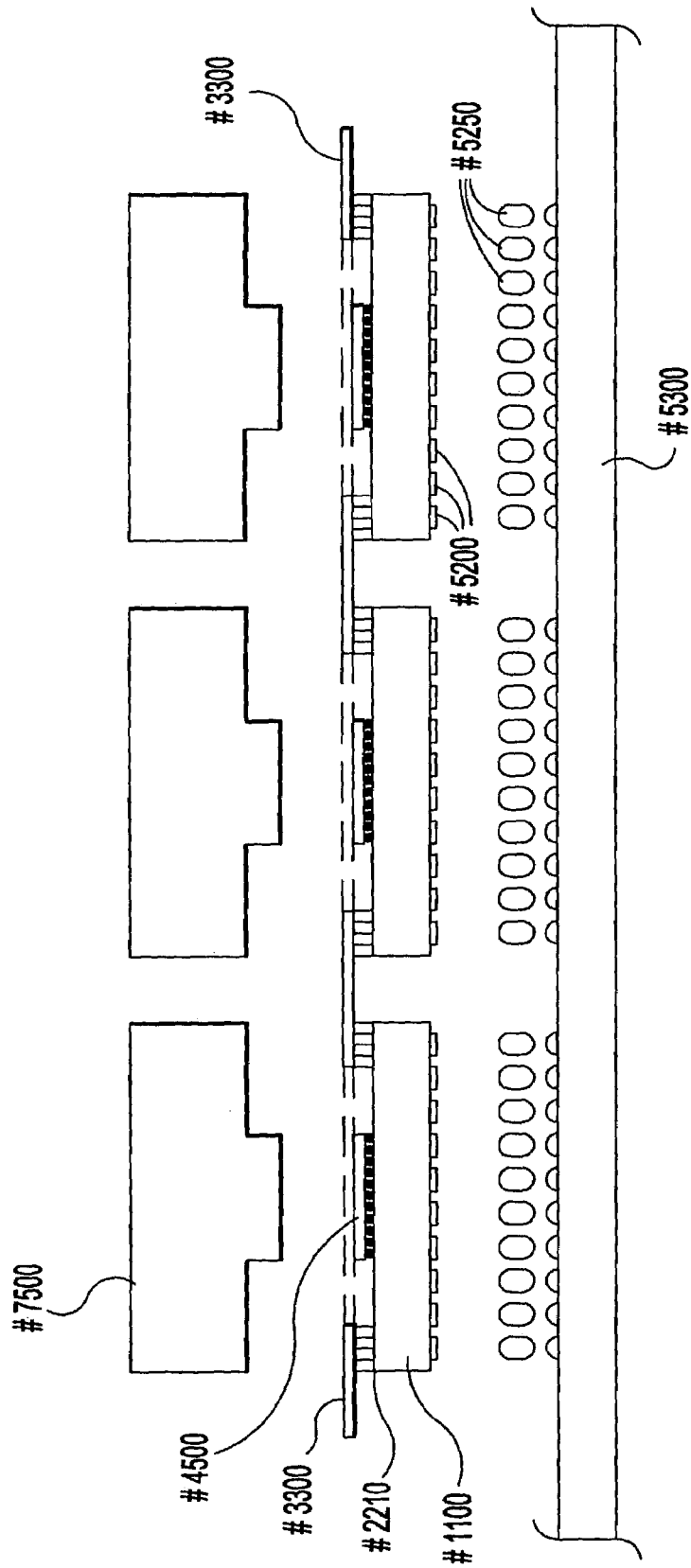
FIG. 11 shows a preferred embodiment Rigid Plural Substrate Module (Rigid PSM)
Figure 12:
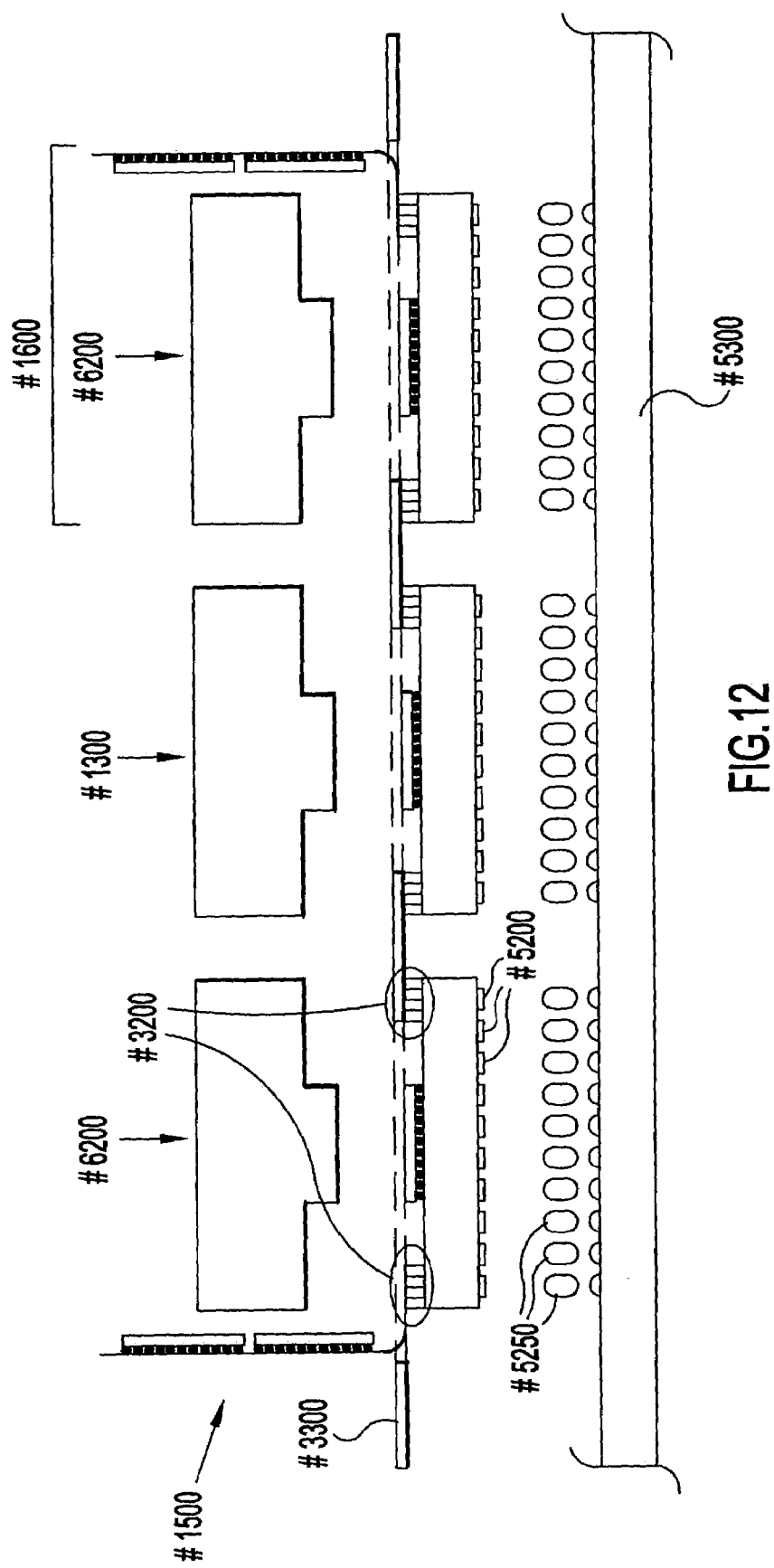
FIG. 12 shows the logical structure of another embodiment of a preferred embodiment Engine Network.

Even more performance is enabled by the Engine Network of FIG. 12. This has a prerequisite of FIG. 11.

FIG. 11 embodies a preferred Rigid Plural Substrate Module #1300 (Rigid PSM). This is closely analogous to the Flexible PSM of FIG. 5. However this includes a Global PWV #3300 which is Rigid, rather than Flexible. This rigidity allows a thicker Global PWV, more wiring layers, and more design versatility.

This Figure shows a vertical cross section of an embodiment. There is a Rigid Global PWV #3300, and one or more preferred Substrates #1100. This preferred Substrate includes a Top Face #2210, with an Inboard Terminal Array #4200, connected to at least one Inboard Chip #4500. Furthermore, this preferred Substrate has a preferred Terminal Array #3200 connected to the Rigid Global PWV.

In a preferred embodiment, the Rigid Global PWV uses copper plus plastic plus fiberglass reinforcement. This can provide economically many layers of wires, which allows very considerable connectivity and topological design versatility. Also this can carry many preferred Substrates, plus many Signal Wires between them.

In most cases, Bonds enable tighter pitch than Connectors. In most cases, to compensate for misalignment, or to relieve stresses, Connectors are better than Bonds.

In a preferred embodiment, the Global PWV and preferred Substrates are assembled and bonded in a factory, under tightly controlled conditions. This forms a preferred Rigid Plural Substrate Module. Thereafter this is stored, installed and removed as a unified Module.

This PSM and its plural preferred Substrates are mounted on an Exterior PWV #5300. A preferred embodiment has Compliant Connector Array #5250 between the Exterior PWV and the Exterior Terminal Array #5200 on a preferred Substrate. These connectors can compensate for some non-coplanarity or other misalignment between the Exterior PWV and the Exterior Terminal Array. Faces of these preferred Substrates. To align and to hold the preferred PSM against the Exterior PWV, there are clamps or other mounting hardware (not visible).

Because of alignment tolerances, and because of the cost of Exterior PWV, therefore the Exterior Terminals Arrays are restricted in density (e.g.: inter-terminal pitch is 1.27 mm rather than 1.00 mm)

In the preferred embodiment, each preferred Substrate also carries a Air Fin or other cooling means #7500.

This PSM structure enables a new process, which leads to many advantages.

First, each Chip is bonded to a Substrate, to form a Small Module. Second, this is burned in, then tested. Third, in case a Chip is defective, then it is relatively easy and cheap to discard and replace a Small Module. Fourth, Underfill may be injected into the Inboard Chip Terminal Array. (Alternatively, Underfill may be injected earlier, depending on details of cost and yield.) This efficiently produces Small Modules and Chips with proven quality. (This proven quality contrasts with the "known-good die problem" in the Prior Art of large Many Chip Modules and Chips.)

Fifth, these Small Modules are accurately placed onto the Global PWV. Preferably, this uses automated precision assembly tools. This establishes mutual alignment between these Small Modules, and minimizes "accumulated" misalignment. Sixth, these Small Modules and Global PWV are assembled, to form a preferred Plural Substrate Module.

Seventh, this PSM is burned-in and tested. Eighth, in case of a defect, the PSM may be reworked. (This may include removal and replacement of a Small Module. Please observe that Underfill has NOT YET being injected between Small Module and Global PWV.) Ninth, Underfill may be injected into the edge Terminal Arrays. This efficiently produces a PSM with proven quality at several levels.

Tenth, this EdgFlwr PSM is aligned and connected to the Exterior PWV.

An MCM uses a very large monolithic Substrate where many IC Chips can be bonded, mutually connected, and connected to an Exterior PWV. A PSM and a large Multi-Layer Ceramic Many Chip Module (MLC MCM) can provide many similar functions. Both can mount and interconnect many IC Chips.

An MCM has the possible advantage of shorter latency between IC Chips, compared to an corresponding PSM.

However, if the IC Chips are numerous or complex, an MCM incurs many problems: bum-in, test, aggregate yield, cost, concentrated power distribution, concentrated cooling, maximum number of chips. By contrast, a corresponding PSM enjoys many advantages.

An PSM can be significantly less costly. For a large MLC MCM, the Substrate cost increases faster than linearly with area, due to yield, production volume, capital, and fabrication tool limits. Small ceramic Substrates have considerably lower cost/area.

For an MCM, the maximum area and maximum number of IC Chips is constrained by tool limits and capital cost. An PSM is very much less constrained. For a Rigid PWC with copper, polymer and fiberglass, the cost/area is notably cheap, and the maximum size is extremely large.

The prior art of large MLC MCMs struggles with the "known-good die problem". It is hard to thoroughly burn-in and test an IC Chip before it is mounted on a substrate. After an IC Chips is mounted on a large MLC MCM, if an IC Chip becomes defective, then it is difficult and costly to remove and replace.

By contrast, in the above procedure for an PSM, Steps One through Four effectively eliminate this problem. The Small Modules, as described above, facilitate early burn-in and test. In case there is a defect, a Small Module is relatively easy to rework and cheap to discard. This establishes the quality of each Small Module. Therefore, after an PSM is assembled, then defects ought to be rare Thus PSM-level rework will rarely be necessary. This strongly reduces the average penalty for such rework (i.e.: the product of rework probability times rework cost).

Also, Steps Five and Six enable accurate mutual alignment between Small Modules bonded to the PWV. Therefore, during the Tenth step, the overall PSM can be readily aligned to the Exterior PWV. (This prevents the problem of inaccurate mutual alignment of Substrates, which degrades alignment with the Exterior PWV.)

This PSM enables considerably more design freedom, compared to the prior art of Many Chip Module (MCM). For example, it is feasible and economical to fabricate a very large Rigid Global PWV. This enables a PSM with many preferred Substrates and many Inboard IC Chips. By contrast, the maximum size of a Prior Art large MCM is limited by practical factories and tools for the large substrate. Also, a PSM has a cost advantage over MCMs. Conversely, if one compares modules with the same cost, then PSM enables interconnecting more Chips. However, a Many Chip Module enables shorter latency between its chips, compared to latency for an PSM.

A large MCM, densely loaded with high-power chips, has a very high density of power and heat. This presents challenges in power distribution and in cooling. By contrast, an PSM with the same chips has lower average density of power and heat. Thus power distribution and cooling are easier.

Fabrication tools limit the maximum size of a MLC Substrate. This limits the maximum connectivity between and MCM and an Exterior PWV. By contrast, an PSM can include many preferred Substrates, which enable even more connectivity between PSM and Exterior PWV.

As described below, an PSM leads to a preferred Compound Module, leads to further advantages compared to a MCM.

FIG. 12 shows an example with several overlapping structures including a Rigid Compound Module #1500, which comprises a Rigid PSM #1300 and one or more preferred Engine Modules #1600. One or more preferred Substrate #1100 simultaneously is part of an preferred Engine Module, and is part of said Rigid PSM.

FIG. 12 embodies several overlapping structures. FIG. 12 embodies a Rigid EdgFlr Compound Module #1500, which comprises a Rigid EdgFlr PSM #1300 and one or more EdgFlr Engine Modules #1600. One or more EdgFlr Substrate #1100 simultaneously is part of an EdgFlr Engine Module, and is part of said Rigid EdgFlr PSM.

FIG. 12 and FIG. 13 are different views of the same embodiment. Many elements which are not visible in one Figure are nevertheless are visible in the other Figure.

Also, FIG. 12 shows the logical structure of another embodiment of an Engine Network #1700. This is analogous to FIG. 10. Once again, this embodiment includes a Network (not visible) with Nodes #6200, one or more preferred Engine Module #1600, Main Memory (not visible), an Input-Output Processor (not visible). Preferable, each preferred Engine Module includes a Distributor (not visible).

In contrast with FIG. 10, the following features are distinctive for this embodiment. There is a preferred Rigid Compound Module #1500, which provides a Rigid Global PWV #3300. This includes Signal Wires (not visible) which provides a Network (not visible). Also, the Rigid Global PWV include one or more Nodes #6200 which connect to one or more edge Terminal Array #3200 of one or more preferred Engine Modules #1600. The Exterior PWB #5300 carries one or more Compliant Connector Array #5250 that can mate with an Exterior Terminal Array #5200 of an preferred Engine Module #1600. However this Compliant Connector Array #5200 is distinct from a Node #6200 of the Network #6300 provided by the Global Rigid PWV #3300.

FIG. 13 is a logical block diagram of an Engine Network #1700 with 8 preferred Engine Modules #1600. This diagram approximates a plan view. (By contrast, FIG. 11 showed a vertical cross-section view of a similar Engine Network.) In FIG. 13, between each pair of preferred Engine Modules, there is a dedicated Signal Wire Bundle #3300, #5400 in the Rigid Global PWV #3300.

There are 8 preferred Engine Modules #6510, #1600, located with 8-fold symmetry. Each Module includes a preferred Substrate #1100 (symbolized as a square), plus an Inboard IC Chip #4500 (symbolized as smaller square) with microProcessor (uP) and Distributor, plus preferred IC Chip(s) with Memory #3500 (symbolized as a narrow rectangle). Optionally, there is a central preferred Substrate #1100 with one or more Inboard IC Chips #4500 (The symbols are similar to those for an Engine Module).

There is a large 8-sided Rigid Global PWV #3500 (symbolized by its 8-sided perimeter). This provides a Network #6300 with Nodes #6200. There are 8+1 Nodes to mate with 8 preferred Engine Modules #6520 plus one Central preferred Substrate #6520 (see below). Each Node and its Terminal Arrays are symbolized as several large dots located around a square. Between each pairs of Modules, there is a dedicated Signal Wire Bundle #5400 (symbolized as a Line with graphic style 1).

Also, preferably there is some Main Memory (not visible) and at least one Input-Output Processor (not visible). One or more preferred Engine Module connects, through its Exterior Terminal Array (not visible), through an Exterior PWV (not visible), into the Exterior PWV (not visible), through a Signal Wire Bundle #5410 (symbolized as a Line with graphic style 2), to Main Memory. Likewise, one or more preferred Engine Module connects, through its Exterior Terminal Array, through the Exterior PWV, through another Signal Wire Bundle #5420 (symbolized as a Line with graphic style 3), to an Input-Output Processor.

In some embodiments optionally , between an preferred Substrate and Main Memory, or between an preferred Substrate and an Input Output Processor, the Signal Wire Bundle may include one or more optical fiber (not visible) and one or more electro-optical transceiver (not visible). Such optical element shall described as part of the Exterior PWV.

Optionally, some embodiments may include a Central preferred Substrate #6520 located near the center of the Rigid Global PWV #3300. Between this Central Substrate and each preferred Engine Module #6510, there is a Signal Wire Bundle #6530. These central resources may be useful for centralized functions. One example is a centralized Directory of entries in various Caches and in Main Memory.

Another example is a centralized assignment of Execution Threads to plural Engines. Another example is centralized coordination between plural Engines. However, there are important restrictions on central resources and central functions.

Total centralized connectivity is defined as the maximum total number of signal wires between the Central Substrate and all preferred Engine Modules. Total decentralized connectivity is defined as the maximum total number of signal wires between all pairs of preferred Engine Modules. Signal frequency times connectivity implies bandwidth.

Technology restricts the connectivity to any preferred Substrate. Furthermore, connectivity and frequency restrict bandwidth, which restricts program execution. Therefore, total centralized connectivity is much more restricted, and much smaller, compared to total decentralized connectivity. Therefore also, execution of central functions is much more constrained than execution of decentralized functions.

In the embodiment of FIG. 13, decentralized connectivity and execution have about an 8-fold advantage over centralized connectivity and execution. Thus it is preferable to maximize decentralized functions and to minimize centralized functions.

This provides Signal Wire Bundles with short latency and wide wideband between all pairs of uPs, and between each Engine and all preferred Caches. In a preferred embodiment, between each pair of preferred Engine Modules, there is a Signal Wire Bundle which includes 16*9=144 transmission lines. Also, the preferred embodiment of the Distributor includes a "non-blocking Switch". Therefore an preferred Cache can transfer data to or from various Ports, and hence can serve both adjacent or non-adjacent microprocessors. This provides massive connectivity, without localized bottlenecks.

Thus, all preferred Caches together can provide a Very Large M3 Shared Cache which serves all uPs. This is fruitful for the IBM z9000 mainframe computer architecture.

As described above, a large PSM can provide more connectivity to an Exterior PWV, compared to a corresponding MCM. Therefore an Compound Module can provide more total connectivity between uPs and MM, and between uP and input/output Processors, compared to a corresponding MCM.

Thus also, identical Engine Modules can be common hardware across all three categories of Server Computers.

This embodiment enjoys many features to prevent local wire congestion and logical bottlenecks.

The Rigid Global PWV has roughly uniform density of Signal Wire Bundles. This largely avoids wire congestion. This enables the Rigid Global PWV to have: relatively few layers of wire; relatively moderate wiring density per layer; relatively low cost.

In a preferred embodiment, the Rigid Global PWV supports 8 directions of wiring (North, Northeast, East, Southeast, South, Southwest, West, Northwest), including true diagonal wires. This avoids clumsiness due to "staircase diagonal wires". Also, this facilitates the 8-fold symmetry of this design. This reduces design effort, development cost and inventory cost. Also, this prevents long signal bundles, and thus minimizes worst-case signal propagation latency.

Likewise, the Signal Wire Bundles from Engines to Main Memory and to Input-Output Processors are similarly symmetric and decentralized. This reduces wire congestion and data bottlenecks, particularly compared to more centralized systems.

In the art of electronic interconnections, there are many variations. These may be applied to the structures of this invention by someone skilled in relevant arts. Here follow some examples.

Structures with an PWV may use a Flexible or Rigid PWV.

These structures may use many variations of Bonds, such as: tiny solder balls, wire bonds, Tape Automated Bonds, and more. Bonds may formed by heating using: an oven, a hot vapor, a thermode, a laser, and more. Bonds may be formed by micro-welding using: a laser, a thermode, ultrasonic vibrator, and more. These Bonds may or may not be reinforced with Underfill.

Such Bond variations may be used between an Inboard IC Chip and Substrate, between an edge Terminal Array and PWV, between PWV and Sidecard PWV, between Sidecard PWV and preferred IC Chip.

These structures may use many variations of Connectors, such as: a tiny metal spring; an elastomer with electroconductive filling; a tiny wad of springy wire; a tiny pin and tiny socket; and more. Connectors facilitate rework and field replacement. (By contrast, Bonds are more permanent.) Also, some connector variations provide compensation for some misalignment or other geometric perturbations of mating components. Similar connectors are used between a Many Chip Module MCM and an Exterior PWV.

Depending on policy for rework and field replacement, Connector variations or Bonds variations may be used between an Exterior PWV and an Exterior Terminal Array on an preferred Module.

An Inboard Terminal and Inboard IC Chip may have various locations: the Top Face of the Substrate, the Bottom Face of the Substrate, a Face in a Cavity in the Substrate.

An EdgFlr IC Chip may be connected to a Sidecard PWV, or connected directly on an PWV.

An preferred IC Chip may be connected to a Sidecard PWV, or connected directly on an PWV.

An preferred IC Chip(s) may be bonded on the inner, outer, both faces of a Sidecard or inner, outer, both faces of an PWV.

An preferred IC Chip(s) may be cooled through the Air Fin, or cooled through air flow directly over this Chip.

An edge Terminal Array may be located on Top or Bottom Face of a Substrate. Also, some Substrates have appreciable thickness. Thus the Substrate is surrounded by four rectangular "Sidewalls" with significant area. Also, an edge Terminal Array has can fits inside a narrow rectangle. Thus, an edge Terminal Array may be located on a Sidewall. One could fabricate a Substrate with a face at an intermediate angle, neither parallel nor perpendicular to the Top. An edge Terminal Array could be located on this intermediate face.

An edge Terminal Array may connect: to a single PWV, to plural overlapped PWVs, to the middle of a looped-over PWV.

A preferred Module with a edge Terminal Array may include a single, a few, or many Inboard IC Chips.

A PWV and Sidecard PWV may connect to an external Cable as well as connect to a preferred IC Chip. In other, the FCM structure may be combined with the preferred module with Cable.

Electronic signal transmission or optical signal transmission may be used in a Cable with a preferred Module. Ditto for an PWV, and ditto for an Exterior PWV. In other words, a Signal Wire may describe an electronic transmission line or an optical fiber.

In the art of computer engineering, there are many variations. These may be applied to the structures of this invention by someone skilled in relevant arts. Here follow some examples.

There are various "architectures" for a microProcessor (e.g.: Intel x86, IBM RISC, IBM S/390, and more). These differences may be encapsulated by Distributors, to enable data transfer between dissimilar uPs. Thus an Engine Network may include different uPs.

A microprocessor and Distributor may be provided as a unified IC Chip, or as separate IC Chips.

In the prior art of Cache, Memory and related Directory(s), there are various algorithms and structures. These may be applied to embodiments of this invention.

Various algorithms determine when a data change in one Cache is propagated to another Cache or Memory. Two examples are "write-in" and "write-through" algorithms.

When the uP requests data, it must locate the data (i.e.: translate a Logical Address to a Real Address). This translation uses a Directory(s) which lists locations for entries in Caches and MM. There are various Directory structures, and various algorithms for this translation. In particular, there are many Caches. (For example, each Engine Module has 3 levels of Cache. Also, a Network in FIG. 13 has 8 Engines.) The aggregate Directory may be centralized or decentralized, with entries that are unique or redundant. Also, there are various policies to maintain coherence between plural Caches and plural Directories. These variation may be superimposed on the Engines and Networks of this invention.

To connect plural Engines, there are many network topologies. One is a fully connected network. Another is a hypercube network. An Engine network may use these or other topologies.

A fully connected network provides most mutual connectivity between Nodes. To transfer data always requires one step, which minimizes latency and avoids blocking. However, as the number of nodes increase, the number of wires increase quadratically, which may become a problem.

A hypercube network provides considerable connectivity between Nodes. As the number of nodes increase, the number of wires increase as linear*logarithm. However, to transfer data on a hyperecube often requires a logarithmic number of steps. This increases latency and may lead to blocking.

While the invention has been described in terms of several (example) preferred embodiments, those skilled in the art will recognize that the invention can be practiced with modification within the spirit and scope of the appended claims.

LIST OF TAGS AND NAMES FOR ITEMS
SHOWN IN THE FIGURES

1000 =Preferred Structures:
1100 =preferred Substrate (SS)
1200 =preferred Module
1300 =Plural Substrate Module (PSM)
1400 =Few Chip Module (FCM)
1500 =Compound Module
1600 =preferred Engine Module
1700 =Engine Network
2000=Substrate Region:
2100=Substrate (SS)
2110=First Face
2120=Second Face
2210=Top Face
2220=Bottom Face
2300=Long Edge
Adjectives=North, South, East, West, Bot
Adjectives=Rigid, Flexible
Adjectives=Local, Global Pattern:
x000=Region
x200=Regional Terminal Array
x300=Regional PWV
x500=Regional IC Chip
3000=Region:
3100=First Substrate Signal Wires bet. EdgFlr Terminals and Inboard Terminals.
3120=Volume dedicated to First Substrate Signal Wires
3200=Terminal Array on Substrate
3300=PWV
3302=Large Hole in Rigid PWV
3304=Long Lever Arm
3306-X,Y,Z=Direction Axes
3308=Slack in Flexible PWV
3310=Proximal Terminal Array of PWV
3320=Signal Wires in PWV
3330=Signal Wire Bundle in PWV
3340=Distal Terminal Array of PWV
3400=External Structure
3410=SideCard PWV
3500=Preferred IC Chip
3510=preferred Memory
3520=preferred Cache
3530=preferred Directory
3600=Connection
3610=Solder Bond
3620=Underfill
4000=Inboard Region:
4200=Inboard Terminal Array
4500=Inboard IC Chip
4510=Inboard IC Chip with Logic
4610=Solder Bonds between IC Chip and Inboard Terminal Array
4620=Underfill between IC Chip and Inboard Terminal Array
5000=Exterior Region:
5100=Second Substrate Signal Wire in bet. Exterior Terminals and Inboard Terminals
5200=Exterior Terminal Array on SS
5250=Compliant Connector Array between SS Ext Terminal Array and Exterior PWV
5300=Exterior PWV
5310=Terminal Array on ExtPWV
5320=Inner Zone of ExtPWV
5320=Outer Zone of ExtPWV
5400=Signal Wire or Signal Wire Bundle in ExtPWV
5410=Signal Wire Bundle in ExtPWB to Main Memory
5420=Signal Wire Bundle in ExtPWB to Input-Output Processor
Adjectives=Adjacent, Non-adjacent
6000=Network Structures:
6100-N,S,E,W, A,B,C,D=Ports
6200=Node
6210=Unoccupied Node
6300=Network
6310=Bus in BotPWB
6320=Network in Gbl PWV
6330=Signal Wire Bundle in Global PWV
6340=Termination
6510=Engine Module in Compound Module

6520=Central Module in Compound Module
6600=Signal Wire Bundle in Ext PWB
6610=Signal Wire Bundle in Ext PWB to Main Memory
6620=Signal Wire Bundle in Ext PWB to Input-Output Processor
6630=Signal Wire Bundle in Global PWB from Central Substrate to preferred Engine Module.
6340=Termination
7000=Other:
7100=Cable
7200=Clamp
7300=Optical Fiber
7400=ElectroOptical Transceiver
7500=Air Fin
7510=Heat Spreader
7520=Gap
8000=Active Structures:
8100=preferred Cache or preferred Memory
8200=Main Memory (MM)
8300=Input-Output Processor (IOP)
8400=Inboard IC Chip With Logic
8410=MicroProcessor (uP)
8415=Central Processing Unit (CPU)
8420=M1 Tiny Cache on Inboard IC Chip
8430=M2 Small Cache on Inboard IC Chip
8435=Small Directory on IC Chip
8440=M3 Very Large Cache
8445=Very Large Directory
8500=Distributor
8510=Distributor Switch
8520=Distributor Buffer
8530=Distributor Controller

We claim:

1. A multi-connect substrate comprising:
a multilayered substrate;
at least one edge array of terminals along an edge of a first face of said multilayered substrate;
at least one inboard array of terminals on said first face;
at least one exterior array of terminals on a second face of said multilayered substrate; and
a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals.

2. An integrated circuit (IC) module comprising:
a multilayered substrate;
at least one edge array of terminals along an edge of a first face of said multilayered substrate;
at least one inboard array of terminals on said first face;
at least one exterior array of terminals on a second face of said multilayered substrate;
a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals; and
at least one inboard electronic component, attached to one said at least one inboard array.

3. An integrated circuit (IC) module comprising:
a multilayered substrate;
at least one edge array of terminals along an edge of a first face of said multilayered substrate;
at least one inboard array of terminals on said first face;
at least one exterior array of terminals on a second face of said multilayered substrate;
a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals; and
a printed wire vehicle connected to one said at least one edge array.

4. An integrated circuit (IC) module comprising:
a multilayered substrate;
at least one edge array of terminals along an edge of a first face of said multilayered substrate;
at least one inboard array of terminals on said first face;
at least one exterior array of terminals on a second face of said multilayered substrate;
a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals;
a printed wire vehicle attached to one said at least one edge array, and
an external structure connected to said printed wire vehicle.

5. A multi chip module, compromising:
a multilayered substrate;
at least one edge array of terminals along an edge of a first face of said multilayered substrate;
at least one inboard array of terminals on said first face;
at least one exterior array of terminals on a second face of said multilayered substrate;
a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals;
a printed wire vehicle connected to one said at least one edge array;
at least one inboard electronic component connected to one said at least one inboard array; and
an electronic component connected through said printed wire vehicle to one said at least one edge array.

6. A multi chip module comprising:
a plurality of multi-connect substrates, each of said multi-connect substrates comprising:
a multilayered substrate,
at least one edge array of terminals along an edge of a first face of said multilayered substrate,
at least one inboard array of terminals on said first face,
at least one exterior array of terminals on a second face of said multilayered substrate, and a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals;

a local printed wire vehicle attached to one or more said at least one edge array;

at least one electronic component connected to said local printed wire vehicle;

at least one inboard electronic component attached to said at least one inboard array; and a global printed wire vehicle connecting said plurality of multi connect substrates together at a respective said at least one edge array.

7. An integrated circuit (IC) module comprising:
a multilayered substrate;
at least one edge array of terminals along an edge of a first face of said multilayered substrate;
at least one inboard array of terminals on said first face;
at least one exterior array of terminals on a second face of said multilayered substrate;
a plurality of signal wires passing through said multilayered substrate, at least one of said plurality of signal wires connecting a terminal on said at least one edge array of terminals with a corresponding terminal in said at least one inboard array and at least one other of said plurality of signal wires connecting a terminal on said at least one inboard array with a corresponding terminal in said at least one exterior array of terminals; and
one or more inboard electronic components, each connected to one said at least one inboard array and forming at least one port means for data transfer through an external channel.

8. An integrated circuit (IC) module compromising:
a multilayered substrate;
at least one edge array of terminals along an edge of a first face of said multilayered substrate;
at least one inboard array of terminals on said first face;
at least one exterior array of terminals on a second face of said multilayered substrate;
a plurality of signal wires passing through said multilayered substrate, at least one of said plurality of signal wires connecting a terminal on said at least one edge may of terminals with a corresponding terminal in said at least one inboard array and at least one other of said plurality of signal wires connecting a terminal on said at least one inboard array with a corresponding terminal in said at least one exterior any of terminals;
a printed wire vehicle connected to one said at least one edge array;
at least one inboard electronic component connected to one said at least one inboard array; and
at least one external electronic component connected to said printed wire vehicle, wherein said inboard electronic component includes some processor logic, and said external electronic component includes some memory.

9. A multi chip module comprising:
at least two integrated circuit (IC) chips, each mounted on a corresponding one of a plurality of multi-connect substrates, each multi-connect substrate comprising:
a multilayered substrate,
an edge array of terminals along each edge of a top surface of said multilayered substrate, each said edge may being a trapezoidal array including 360 terminals,
an inboard array of terminals on said top surface, whereby each of said two IC chips is mounted on one said inboard array,
an exterior array of terminals including 1024 terminals on a bottom face of said multilayered substrate, and
a plurality of signal wire layers in said multilayered substrate, at least one signal wire passing through ones of said signal wire layers connecting a terminal on one said edge may with a corresponding terminal in said inboard array and, at least one other signal wire passing through ones of said signal wire layers connecting a terminal on said inboard array with a corresponding terminal in said exterior array;
a printed wire structure including 360 signal wires connected between two of said plurality of multi-connect substrates, said two including said IC chips, said local printed wire structure connected to one said edge array on each of said two; and
a printed circuit structure with at least two substrate mounting locations, each of said two being mounted at said exterior array to a corresponding one of said at least two substrate mounting locations.

10. A multi-connect substrate, as in claim 1, where said at least one exterior array is an area array.

11. A multi-connect substrate, as in claim 10, where said area array covers a major fraction of said second face.

12. A multi connect substrate, as in claim 1, which has a Thermal Expansion Coefficient similar to the Thermal Expansion Coefficient of silicon.

13. A multi connect substrate, as in claim 1, where said multilayered substrate includes one or more of the following materials: a ceramic, and a fluorocarbon.

14. A multi connect substrate, as in claim 1, where said first face is parallel to said second face.

15. A multi-connect substrate as in claim 1, where said first face is perpendicular to said second face.

16. A multi-connect substrate as in claim 1, where said first face is at an intermediate angle to said second face.

17. An IC module, as in claim 2, where said electric component includes one or more of the following: a passive electronic device, an active electronic device, one or more digital logic devices, a microprocessor, a central processing unit, one or more memories, and an integrated circuit chip.

18. An IC module, as in claim 3, where said printed wire vehicle includes one or more of the following: a flexible printed wire vehicle, a rigid printed wire vehicle, a printed wire card, and a printed wire board.

19. An IC module, as in claim 3, where said Edge Flower Printed Wire Vehicle includes any one or more of the following: an optical fiber, and an electro-optical component.

20. An IC module, as in claim 3, further comprising a printed wire vehicle, wherein one or more of said at least one exterior array is connected to said exterior printed wire vehicle.

21. An IC module, as in claim 20, where said Exterior Printed Wire Vehicle is one or more of the following: a rigid printed wire vehicle, a printed wire board, a printed wire card, and a flexible printed wire vehicle.

22. An IC module, as in claim 4, where said External Structure includes at least one Cable.

23. An IC module, as in claim 4, where said External Structure includes at least one Optical Fiber.

24. An IC module, as in claim 4, further compromising an exterior printed wire vehicle, wherein said exterior printed wire vehicle connects to said printed wire vehicle, and said exterior printed wire vehicle connects to one said at one exterior array.

25. An IC module, as in claim 23, wherein said printed wire vehicle is substantially flexible, and said exterior printed wire vehicle is substantially rigid.

26. An IC module, as in claim 4, further compromising at least one electronic component connected through said printed wire vehicle to said one.

27. An IC module, as in claim 26, Wherein said electronic component includes one or more of the following: a passive electronic component, an active electronic component, an integrated circuit chip, an integrated circuit chip including some memory.

28. An IC module, as in claim 26, wherein said electronic component includes an electro-optical component.

29. An IC module with at least one port means as in claim 7, further comprising a buffer that transforms data flow through said port means.

30. An IC module with at least one port means and at least one communication adapter, as in claim 29, where said communication adapter corresponds to one or more of the following layers: physical layer, data link layer, medium access layer, network layer, transport layer, application layer.

31. An IC module with at least one port means, as in claim 7, further comprising plural ports, and comprising a switch that steers data among said plural ports.

32. An IC module with at least one port, as in claim 7, further comprising plural ports and a Distributor, said Distributor comprising:
- a switch that steers data among plural said ports;
- a buffer that transforms data flow through one or more of said ports; and
- a controller that controls the state of said switch and said buffer.

33. An IC module with at least one port means, as in claim 7, further comprising one or more one communication adapters.

34. An IC module, as in claim 8, further comprising a Distributor, said Distributor comprising:
- a switch that steers data among a plurality of ports;
- a buffer that transforms a rate of data at one or more of said ports; and
- a controller that controls a state of said switch and buffer.

35. An IC module, as in claim 8, wherein said inboard electronic component-attached to said one forms a port for data transfer through an external network.

* * * * *